US009613841B2

(12) United States Patent
Rathburn

(10) Patent No.: US 9,613,841 B2
(45) Date of Patent: Apr. 4, 2017

(54) AREA ARRAY SEMICONDUCTOR DEVICE PACKAGE INTERCONNECT STRUCTURE WITH OPTIONAL PACKAGE-TO-PACKAGE OR FLEXIBLE CIRCUIT TO PACKAGE CONNECTION

(75) Inventor: James Rathburn, Mound, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 972 days.

(21) Appl. No.: 13/410,943

(22) Filed: Mar. 2, 2012

(65) Prior Publication Data

US 2012/0161317 A1 Jun. 28, 2012

Related U.S. Application Data

(63) Continuation-in-part of application No. 13/266,573, filed as application No. PCT/US2010/036363 on May
(Continued)

(51) Int. Cl.
*H01L 23/48* (2006.01)
*H01L 21/60* (2006.01)
(Continued)

(52) U.S. Cl.
CPC .... *H01L 21/6835* (2013.01); *H01L 23/49811* (2013.01); *H01L 23/49822* (2013.01);
(Continued)

(58) Field of Classification Search
USPC ......... 438/14, 17, 15, 18; 257/773, 686, 723
See application file for complete search history.

(56) References Cited

U.S. PATENT DOCUMENTS 3,672,986 A 6/1972 Schneble, Jr. et al.
4,188,438 A 2/1980 Burns
(Continued)

FOREIGN PATENT DOCUMENTS

JP 2003/217774 7/2003
WO WO 91/14015 9/1991
(Continued)

OTHER PUBLICATIONS

Office Action mailed Oct. 30, 2013 in co-pending U.S. Appl. No. 13/266,486, now published as US Patent Application Publication No. US 2012/0055701.
(Continued)

*Primary Examiner* — Eva Y Montalvo
*Assistant Examiner* — David Goodwin

(57) ABSTRACT

An area array integrated circuit (IC) package for an IC device. The IC package includes a first substrate with conductive traces electrically coupled to the IC device. An interconnect assembly having a first surface is mechanically coupled to the first substrate. The interconnect assembly includes a plurality of contact members electrically coupled to the conductive traces on the first substrate. A second substrate is mechanically coupled to a second surface of the interconnect assembly so that the first substrate, the interconnect assembly, and the second substrate substantially surround the IC device. The second substrate includes conductive traces that are electrically coupled to the contact members in the interconnect assembly.

8 Claims, 29 Drawing Sheets

Related U.S. Application Data 27, 2010, now Pat. No. 9,054,097, application No. 13/410,943, which is a continuation-in-part of application No. 13/318,200, filed as application No. PCT/US2010/036288 on May 27, 2010, now Pat. No. 9,136,196, application No. 13/410,943, which is a continuation-in-part of application No. 13/318,263, filed as application No. PCT/US2010/036285 on May 27, 2010, now Pat. No. 8,618,649, application No. 13/410,943, which is a continuation-in-part of application No. PCT/US2011/033726, filed on Apr. 25, 2011, application No. 13/410,943, which is a continuation-in-part of application No. PCT/US2011/062313, filed on Nov. 29, 2011.

(60) Provisional application No. 61/448,282, filed on Mar. 2, 2011, provisional application No. 61/183,411, filed on Jun. 2, 2009, provisional application No. 61/183,356, filed on Jun. 2, 2009, provisional application No. 61/183,348, filed on Jun. 2, 2009, provisional application No. 61/327,795, filed on Apr. 26, 2010, provisional application No. 61/418,625, filed on Dec. 1, 2010.

(51) Int. Cl.
    *H01L 21/683*   (2006.01)
    *H01L 23/498*   (2006.01)
    *H01L 23/60*    (2006.01)
    *H01L 23/00*    (2006.01)
    *H05K 3/34*     (2006.01)

(52) U.S. Cl.
    CPC .. *H01L 23/49827* (2013.01); *H01L 23/49838* (2013.01); *H01L 23/60* (2013.01); *H01L 24/13* (2013.01); *H01L 24/16* (2013.01); *H01L 24/81* (2013.01); *H01L 2221/68345* (2013.01); *H01L 2224/16225* (2013.01); *H01L 2224/81005* (2013.01); *H01L 2224/819* (2013.01); *H01L 2224/8138* (2013.01); *H01L 2224/81191* (2013.01); *H01L 2224/81201* (2013.01); *H01L 2924/01087* (2013.01); *H01L 2924/09701* (2013.01); *H01L 2924/14* (2013.01); *H01L 2924/15311* (2013.01); *H05K 3/3436* (2013.01)

(56) References Cited

U.S. PATENT DOCUMENTS

| | | | |
|---|---|---|---|
| 4,295,700 A | 10/1981 | Sado | |
| 4,489,999 A | 12/1984 | Miniet | |
| 4,922,376 A | 5/1990 | Pommer et al. | |
| 4,964,948 A | 10/1990 | Reed | |
| 5,014,159 A | 5/1991 | Butt | |
| 5,071,363 A | 12/1991 | Reylek et al. | |
| 5,072,520 A | 12/1991 | Nelson | |
| 5,096,426 A | 3/1992 | Simpson et al. | |
| 5,127,837 A | 7/1992 | Shah et al. | |
| 5,129,573 A | 7/1992 | Duffey | |
| 5,161,983 A | 11/1992 | Ohno | |
| 5,167,512 A | 12/1992 | Walkup | |
| 5,208,068 A | 5/1993 | Davis et al. | |
| 5,237,203 A | 8/1993 | Massaron | |
| 5,246,880 A | 9/1993 | Reele et al. | |
| 5,286,680 A | 2/1994 | Cain | |
| 5,334,029 A | 8/1994 | Akkapeddi et al. | |
| 5,358,621 A | 10/1994 | Oyama | |
| 5,378,981 A | 1/1995 | Higgins, III | |
| 5,419,038 A | 5/1995 | Wang et al. | |
| 5,454,161 A | 10/1995 | Beilin et al. | |
| 5,479,319 A | 12/1995 | Werther et al. | |
| 5,509,019 A | 4/1996 | Yamamura | |
| 5,527,998 A | 6/1996 | Anderson et al. | |
| 5,562,462 A | 10/1996 | Matsuba et al. | |
| 5,659,181 A | 8/1997 | Bridenbaugh | |
| 5,674,595 A | 10/1997 | Busacco et al. | |
| 5,691,041 A | 11/1997 | Frankeny et al. | |
| 5,716,663 A | 2/1998 | Capote et al. | |
| 5,741,624 A | 4/1998 | Jeng et al. | |
| 5,746,608 A | 5/1998 | Taylor | |
| 5,761,801 A | 6/1998 | Gebhardt et al. | |
| 5,764,485 A | 6/1998 | Lebaschi | |
| 5,772,451 A | 6/1998 | Dozier et al. | |
| 5,785,538 A | 7/1998 | Beaman et al. | |
| 5,787,976 A | 8/1998 | Hamburgen et al. | |
| 5,791,911 A | 8/1998 | Fasano et al. | |
| 5,802,699 A | 9/1998 | Fjelstad et al. | |
| 5,802,711 A | 9/1998 | Card et al. | |
| 5,819,579 A | 10/1998 | Roberts | |
| 5,904,546 A | 5/1999 | Wood et al. | |
| 5,913,109 A | 6/1999 | Distefano et al. | |
| 5,921,786 A | 7/1999 | Slocum et al. | |
| 5,925,931 A | 7/1999 | Yamamoto | |
| 5,933,558 A | 8/1999 | Sauvageau et al. | |
| 5,973,394 A | 10/1999 | Slocum et al. | |
| 6,020,597 A | 2/2000 | Kwak | |
| 6,062,879 A | 5/2000 | Beaman et al. | |
| 6,080,932 A | 6/2000 | Smith et al. | |
| 6,107,109 A | 8/2000 | Akram et al. | |
| 6,114,240 A | 9/2000 | Akram et al. | |
| 6,118,426 A | 9/2000 | Albert | |
| 6,120,588 A | 9/2000 | Jacobson | |
| 6,137,687 A | 10/2000 | Shirai et al. | |
| 6,172,879 B1 | 1/2001 | Cilia et al. | |
| 6,177,921 B1 | 1/2001 | Comiskey | |
| 6,178,540 B1 | 1/2001 | Lo et al. | |
| 6,181,144 B1 | 1/2001 | Hembree et al. | |
| 6,200,143 B1 * | 3/2001 | Haba ............... | H01R 13/193 29/830 |
| 6,207,259 B1 | 3/2001 | Iino et al. | |
| 6,225,692 B1 | 5/2001 | Hinds | |
| 6,247,938 B1 | 6/2001 | Rathburn | |
| 6,252,564 B1 | 6/2001 | Albert | |
| 6,255,126 B1 | 7/2001 | Mathieu et al. | |
| 6,263,566 B1 | 7/2001 | Hembree et al. | |
| 6,270,363 B1 | 8/2001 | Brofman et al. | |
| 6,288,451 B1 | 9/2001 | Tsao | |
| 6,312,971 B1 | 11/2001 | Amundson | |
| 6,313,528 B1 | 11/2001 | Solberg | |
| 6,320,256 B1 | 11/2001 | Ho | |
| 6,350,386 B1 | 2/2002 | Lin | |
| 6,359,790 B1 | 3/2002 | Meyer-Berg | |
| 6,413,790 B1 | 7/2002 | Duthaler | |
| 6,422,687 B1 | 7/2002 | Jacobson | |
| 6,428,328 B2 | 8/2002 | Haba et al. | |
| 6,437,452 B2 | 8/2002 | Lin | |
| 6,437,591 B1 | 8/2002 | Farnworth et al. | |
| 6,459,418 B1 | 10/2002 | Comiskey | |
| 6,461,183 B1 | 10/2002 | Ohkita | |
| 6,462,418 B2 | 10/2002 | Sakamoto et al. | |
| 6,462,568 B1 | 10/2002 | Cram | |
| 6,477,286 B1 | 11/2002 | Ouchi | |
| 6,490,786 B2 * | 12/2002 | Belke et al. ............. | 29/830 |
| 6,494,725 B2 | 12/2002 | Lin et al. | |
| 6,506,438 B2 | 1/2003 | Duthaler et al. | |
| 6,521,489 B2 | 2/2003 | Duthaler | |
| 6,545,291 B1 | 4/2003 | Amundson | |
| 6,572,396 B2 | 6/2003 | Rathburn | |
| 6,574,114 B1 | 6/2003 | Brindle et al. | |
| 6,593,535 B2 | 7/2003 | Gailus | |
| 6,603,080 B2 | 8/2003 | Jensen | |
| 6,614,104 B2 | 9/2003 | Farnworth et al. | |
| 6,626,526 B2 | 9/2003 | Ueki | |
| 6,639,578 B1 | 10/2003 | Comiskey | |
| 6,642,127 B2 | 11/2003 | Kumar et al. | |
| 6,652,075 B2 | 11/2003 | Jacobson | |
| 6,661,084 B1 | 12/2003 | Peterson et al. | |
| 6,662,442 B1 | 12/2003 | Matsui et al. | |
| 6,709,967 B2 | 3/2004 | Evers | |
| 6,744,126 B1 | 6/2004 | Chiang | |
| 6,750,473 B2 | 6/2004 | Amundson | |

(56) References Cited

U.S. PATENT DOCUMENTS

| | | | |
|---|---|---|---|
| 6,750,551 B1 | 6/2004 | Frutschy et al. | |
| 6,758,691 B1 | 7/2004 | McHugh | |
| 6,765,288 B2 * | 7/2004 | Damberg | H01L 23/5385 257/698 |
| 6,773,302 B2 | 8/2004 | Gutierrez et al. | |
| 6,800,169 B2 | 10/2004 | Liu et al. | |
| 6,809,414 B1 | 10/2004 | Lin et al. | |
| 6,821,131 B2 | 11/2004 | Suzuki et al. | |
| 6,823,124 B1 | 11/2004 | Renn | |
| 6,825,829 B1 | 11/2004 | Albert | |
| 6,827,611 B1 | 12/2004 | Payne et al. | |
| 6,830,460 B1 | 12/2004 | Rathburn | |
| 6,840,777 B2 | 1/2005 | Sathe et al. | |
| 6,853,087 B2 | 2/2005 | Neuhaus et al. | |
| 6,856,151 B1 | 2/2005 | Cram | |
| 6,861,345 B2 | 3/2005 | Ball et al. | |
| 6,910,897 B2 | 6/2005 | Driscoll et al. | |
| 6,946,325 B2 | 9/2005 | Yean et al. | |
| 6,962,829 B2 | 11/2005 | Glenn et al. | |
| 6,965,168 B2 | 11/2005 | Langhorn | |
| 6,967,640 B2 | 11/2005 | Albert | |
| 6,971,902 B2 | 12/2005 | Taylor | |
| 6,987,661 B1 | 1/2006 | Huemoeller et al. | |
| 6,992,376 B2 | 1/2006 | Jaeck | |
| 7,009,413 B1 | 3/2006 | Alghouli | |
| 7,025,600 B2 | 4/2006 | Higashi | |
| 7,029,289 B2 | 4/2006 | Li | |
| 7,040,902 B2 | 5/2006 | Li | |
| 7,045,015 B2 | 5/2006 | Renn | |
| 7,064,412 B2 | 6/2006 | Geissinger et al. | |
| 7,070,419 B2 | 7/2006 | Brown et al. | |
| 7,095,090 B2 | 8/2006 | Nakajima et al. | |
| 7,101,210 B2 | 9/2006 | Lin | |
| 7,114,960 B2 | 10/2006 | Rathburn | |
| 7,118,391 B2 | 10/2006 | Minich et al. | |
| 7,121,837 B2 | 10/2006 | Sato et al. | |
| 7,121,839 B2 | 10/2006 | Rathburn | |
| 7,129,166 B2 | 10/2006 | Speakman | |
| 7,138,328 B2 | 11/2006 | Downey et al. | |
| 7,145,228 B2 | 12/2006 | Yean et al. | |
| 7,148,128 B2 | 12/2006 | Jacobson | |
| 7,154,175 B2 * | 12/2006 | Shrivastava | H01L 23/4985 257/723 |
| 7,157,799 B2 | 1/2007 | Noquil et al. | |
| 7,180,313 B2 | 2/2007 | Bucksch | |
| 7,217,996 B2 | 5/2007 | Cheng et al. | |
| 7,220,287 B1 | 5/2007 | Wyrzykowska et al. | |
| 7,229,293 B2 | 6/2007 | Sakurai et al. | |
| 7,232,263 B2 | 6/2007 | Sashinaka et al. | |
| 7,244,967 B2 | 7/2007 | Hundt et al. | |
| 7,249,954 B2 | 7/2007 | Weiss | |
| 7,276,919 B1 | 10/2007 | Beaman et al. | |
| 7,301,105 B2 | 11/2007 | Vasoya | |
| 7,321,168 B2 | 1/2008 | Tao | |
| 7,326,064 B2 | 2/2008 | Rathburn | |
| 7,327,006 B2 | 2/2008 | Svard et al. | |
| 7,337,537 B1 | 3/2008 | Smetana, Jr. | |
| 7,382,363 B2 | 6/2008 | Albert et al. | |
| 7,402,515 B2 | 7/2008 | Arana et al. | |
| 7,410,825 B2 | 8/2008 | Majumdar et al. | |
| 7,411,304 B2 | 8/2008 | Kirby et al. | |
| 7,417,299 B2 | 8/2008 | Hu | |
| 7,417,314 B1 | 8/2008 | Lin et al. | |
| 7,422,439 B2 | 9/2008 | Rathburn et al. | |
| 7,423,219 B2 | 9/2008 | Kawaguchi et al. | |
| 7,427,717 B2 | 9/2008 | Morimoto et al. | |
| 7,432,600 B2 | 10/2008 | Klein et al. | |
| 7,458,150 B2 | 12/2008 | Totokawa et al. | |
| 7,459,393 B2 | 12/2008 | Farnworth et al. | |
| 7,485,345 B2 | 2/2009 | Renn | |
| 7,489,524 B2 | 2/2009 | Green et al. | |
| 7,508,076 B2 | 3/2009 | Japp et al. | |
| 7,527,502 B2 | 5/2009 | Li | |
| 7,531,906 B2 | 5/2009 | Lee | |
| 7,536,714 B2 | 5/2009 | Yuan | |
| 7,537,461 B2 | 5/2009 | Rathburn | |
| 7,538,415 B1 | 5/2009 | Lin et al. | |
| 7,548,430 B1 | 6/2009 | Huemoeller et al. | |
| 7,563,645 B2 | 7/2009 | Jaeck | |
| 7,595,454 B2 | 9/2009 | Kresge et al. | |
| 7,619,309 B2 | 11/2009 | Drexl et al. | |
| 7,621,761 B2 | 11/2009 | Mok et al. | |
| 7,628,617 B2 | 12/2009 | Brown et al. | |
| 7,632,106 B2 | 12/2009 | Nakamura | |
| 7,645,635 B2 | 1/2010 | Wood et al. | |
| 7,651,382 B2 | 1/2010 | Yasumura et al. | |
| 7,658,163 B2 | 2/2010 | Renn | |
| 7,674,671 B2 | 3/2010 | Renn | |
| 7,726,984 B2 | 6/2010 | Bumb et al. | |
| 7,736,152 B2 | 6/2010 | Hougham et al. | |
| 7,748,110 B2 | 7/2010 | Asahi et al. | |
| 7,758,351 B2 | 7/2010 | Brown et al. | |
| 7,800,916 B2 | 9/2010 | Blackwell et al. | |
| 7,833,832 B2 | 11/2010 | Wood et al. | |
| 7,836,587 B2 | 11/2010 | Kim | |
| 7,868,469 B2 | 1/2011 | Mizoguchi | |
| 7,874,847 B2 | 1/2011 | Matsui et al. | |
| 7,897,503 B2 | 3/2011 | Foster et al. | |
| 7,898,087 B2 | 3/2011 | Chainer | |
| 7,955,088 B2 | 6/2011 | Di Stefano | |
| 7,999,369 B2 | 8/2011 | Malhan et al. | |
| 8,044,502 B2 | 10/2011 | Rathburn | |
| 8,058,558 B2 | 11/2011 | Mok et al. | |
| 8,072,058 B2 | 12/2011 | Kim et al. | |
| 8,114,687 B2 | 2/2012 | Mizoguchi | |
| 8,120,173 B2 | 2/2012 | Forman et al. | |
| 8,148,643 B2 | 4/2012 | Hirose et al. | |
| 8,154,119 B2 | 4/2012 | Yoon et al. | |
| 8,158,503 B2 | 4/2012 | Abe | |
| 8,159,824 B2 | 4/2012 | Cho et al. | |
| 8,178,978 B2 | 5/2012 | McElrea et al. | |
| 8,203,207 B2 | 6/2012 | Getz et al. | |
| 8,227,703 B2 | 7/2012 | Maruyama et al. | |
| 8,232,632 B2 | 7/2012 | Rathburn | |
| 8,247,702 B2 | 8/2012 | Kouya | |
| 8,278,141 B2 | 10/2012 | Chow et al. | |
| 8,299,494 B2 | 10/2012 | Yilmaz et al. | |
| 8,329,581 B2 | 12/2012 | Haba et al. | |
| 8,344,516 B2 | 1/2013 | Chainer | |
| 8,373,428 B2 | 2/2013 | Eldridge et al. | |
| 8,421,151 B2 | 4/2013 | Yamashita | |
| 8,525,322 B1 | 9/2013 | Kim et al. | |
| 8,525,346 B2 | 9/2013 | Rathburn | |
| 8,536,714 B2 | 9/2013 | Sakaguchi | |
| 8,536,889 B2 | 9/2013 | Nelson et al. | |
| 8,610,265 B2 | 12/2013 | Rathburn | |
| 8,618,649 B2 | 12/2013 | Rathburn | |
| 8,758,067 B2 | 6/2014 | Rathburn | |
| 8,789,272 B2 | 7/2014 | Rathburn | |
| 8,803,539 B2 | 8/2014 | Rathburn | |
| 8,829,671 B2 | 9/2014 | Rathburn | |
| 8,912,812 B2 | 12/2014 | Rathburn | |
| 8,928,344 B2 | 1/2015 | Rathburn | |
| 8,955,215 B2 | 2/2015 | Rathburn | |
| 8,955,216 B2 | 2/2015 | Rathburn | |
| 8,970,031 B2 | 3/2015 | Rathburn | |
| 8,981,568 B2 | 3/2015 | Rathburn | |
| 8,981,809 B2 | 3/2015 | Rathburn | |
| 8,984,748 B2 | 3/2015 | Rathburn | |
| 8,987,886 B2 | 3/2015 | Rathburn | |
| 8,988,093 B2 | 3/2015 | Rathburn | |
| 2001/0012707 A1 | 8/2001 | Ho et al. | |
| 2001/0016551 A1 | 8/2001 | Yushio et al. | |
| 2002/0011639 A1 | 1/2002 | Carlson et al. | |
| 2002/0027441 A1 | 3/2002 | Akram et al. | |
| 2002/0062200 A1 | 5/2002 | Mori et al. | |
| 2002/0079912 A1 | 6/2002 | Shahriari et al. | |
| 2002/0088116 A1 | 7/2002 | Milkovich et al. | |
| 2002/0098740 A1 | 7/2002 | Ooya | |
| 2002/0105080 A1 | 8/2002 | Speakman | |
| 2002/0105087 A1 | 8/2002 | Forbes et al. | |
| 2002/0160103 A1 | 10/2002 | Fukunaga et al. | |
| 2003/0003779 A1 | 1/2003 | Rathburn | |
| 2003/0096512 A1 | 5/2003 | Cornell | |

(56) References Cited

U.S. PATENT DOCUMENTS

| | | |
|---|---|---|
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0020116 A1 | 1/2005 | Kawazoe et al. |
| 2005/0048680 A1 | 3/2005 | Matsunami |
| 2005/0100294 A1 | 5/2005 | Nguyen et al. |
| 2005/0101164 A1 | 5/2005 | Rathburn |
| 2005/0162176 A1 | 7/2005 | Bucksch |
| 2005/0164527 A1 | 7/2005 | Radza et al. |
| 2005/0196511 A1 | 9/2005 | Garrity et al. |
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Andersen |
| 2006/0087064 A1 | 4/2006 | Daniel et al. |
| 2006/0125500 A1 | 6/2006 | Watkins et al. |
| 2006/0145338 A1 | 7/2006 | Dong |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2006/0281303 A1 | 12/2006 | Trezza et al. |
| 2007/0021002 A1 | 1/2007 | Laurx et al. |
| 2007/0057382 A1 | 3/2007 | Liu et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1 | 11/2007 | White et al. |
| 2007/0269999 A1 | 11/2007 | Di Stefano |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0020624 A1 | 1/2008 | Nikaido et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0115961 A1 | 5/2008 | Mok et al. |
| 2008/0143358 A1 | 6/2008 | Breinlinger |
| 2008/0143367 A1 | 6/2008 | Chabineau-Lovgren |
| 2008/0156856 A1 | 7/2008 | Barausky et al. |
| 2008/0157361 A1 | 7/2008 | Wood et al. |
| 2008/0182436 A1 | 7/2008 | Rathburn |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0246136 A1 | 2/2009 | Beer et al. |
| 2009/0058444 A1 | 3/2009 | McIntyre |
| 2009/0061089 A1 | 3/2009 | King et al. |
| 2009/0065918 A1 | 3/2009 | Murphy |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0321915 A1 | 12/2009 | Hu et al. |
| 2010/0022105 A1 | 1/2010 | Di Stefano |
| 2010/0133680 A1 | 6/2010 | Kang et al. |
| 2010/0143194 A1 | 6/2010 | Lee et al. |
| 2010/0213960 A1 | 8/2010 | Mok et al. |
| 2010/0300734 A1 | 12/2010 | Ables et al. |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0242816 A1 | 8/2014 | Rathburn |
| 2015/0013901 A1 | 1/2015 | Rathburn |
| 2015/0091600 A1 | 4/2015 | Rathburn |
| 2015/0136467 A1 | 5/2015 | Rathburn |

(56) References Cited

U.S. PATENT DOCUMENTS

| | | |
|---|---|---|
| 2015/0162678 A1 | 6/2015 | Rathburn |
| 2015/0181710 A1 | 6/2015 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO-2012/061008 | 5/2012 |
| WO | WO-2012/074963 | 6/2012 |
| WO | WO-2012/074969 | 6/2012 |
| WO | WO-2012/078493 | 6/2012 |
| WO | WO 2012/122142 | 9/2012 |
| WO | WO 2012/125331 | 9/2012 |
| WO | WO 2013/036565 | 3/2013 |
| WO | WO-2014/011226 | 1/2014 |
| WO | WO-2014/011228 | 1/2014 |
| WO | WO-2014/011232 | 1/2014 |
| WO | WO-2015/006393 | 1/2015 |

OTHER PUBLICATIONS

Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Response to Restriction Requirement filed Oct. 7, 2013 in co-pending U.S. Appl. No. 13/266,573, now published as US Patent Application Publication No. 2012/0061846.
Office Action mailed Nov. 22, 2013 in co-pending U.S. Appl. No. 13/266,907, now published as US Patent Application Publication No. US 2012/0268155.
Restriction Requirement mailed Dec. 9, 2013 in co-pending U.S. Appl. No. 13/318,171, now published as US Patent Application Publication No. US 2012/0049877.
Response to Restriction Requirement filed Dec. 17, 2013 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amendment and Response filed Nov. 20, 2013 in co-pending U.S. Appl. No. 13/413,724, now published as US Patent Application Publication No. US 2012/0168948.
Notice of Allowance and Fee(s) Due mailed Dec. 6, 2013 in co-pending U.S. Appl. No. 14/058,863.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.
Co-pending U.S. Appl. No. 14/058,863 titled Compliant Core Peripheral Lead Semiconductor Socket, filed Oct. 21, 2013.
Co-pending U.S. Appl. No. 14/086,029 titled Compliant Printed Circuit Semiconductor Package, filed Nov. 21, 2013.
Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Restriction Requirement mailed Nov. 23, 2012 in co-pending U.S. Appl. No. 13/318,263, now published as US Patent Application Publication No. US 2012/0043667.
Co-pending U.S. Appl. No. 13/643,436 titled Semiconductor Device Package Adapter, filed Oct. 25, 2012.
Co-pending U.S. Appl. No. 13/700,639 titled Electrical Connector Insulator Housing, filed Nov. 28, 2012.
Notification of Transmittal of the International Search Report and the Written Opinion of the International Searching Authority issued Jul. 30, 2010 in International Application No. PCT/US2010/036043.
Notification of Transmittal of the International Search Report and the Written Opinion of the International Searching Authority issued Jul. 21, 2010 in International Application No. PCT/US2010/036047.

(56) References Cited

OTHER PUBLICATIONS

Notification of Transmittal of the International Search Report and the Written Opinion of the International Searching Authority issued Jul. 28, 2010 in International Application No. PCT/US2010/036363.
Notification of Transmittal of the International Search Report and the Written Opinion of the International Searching Authority issued Jul. 28, 2010 in International Application No. PCT/US2010/036377.
Notification of Transmittal of the International Search Report and the Written Opinion of the International Searching Authority issued Jul. 30, 2010 in International Application No. PCT/US2010/036388.
Notification of Transmittal of the International Search Report and the Written Opinion of the International Searching Authority issued Jul. 27, 2010 in International Application No. PCT/US2010/036397.
Notification of Transmittal of the International Search Report and the Written Opinion of the International Searching Authority issued Jul. 30, 2010 in International Application No. PCT/US2010/036055.
Notification of Transmittal of the International Search Report and the Written Opinion of the International Searching Authority issued Aug. 4, 2010 in International Application No. PCT/US2010/036288.
Notification of Transmittal of the International Search Report and the Written Opinion of the International Searching Authority issued Aug. 4, 2010 in International Application No. PCT/US2010/036285.
Notification of Transmittal of the International Search Report and the Written Opinion of the International Searching Authority issued Jul. 30, 2010 in International Application No. PCT/US2010/036282.
Notification of Transmittal of the International Search Report and the Written Opinion of the International Searching Authority issued Jul. 30, 2010 in International Application No. PCT/US2010/036295.
Notification of Transmittal of the International Search Report and the Written Opinion of the International Searching Authority issued Jul. 30, 2010 in International Application No. PCT/US2010/036313.
Notification of Transmittal of the International Search Report and the Written Opinion of the International Searching Authority issued Aug. 3, 2010 in International Application No. PCT/US2010/037619.
Notification of Transmittal of the International Search Report and the Written Opinion of the International Searching Authority issued Sep. 7, 2010 in International Application No. PCT/US2010/038600.
Notification of Transmittal of the International Search Report and the Written Opinion of the International Searching Authority issued Aug. 18, 2010 in International Application No. PCT/US2010/038606.
Notification of Transmittal of the International Search Report and the Written Opinion of the International Searching Authority issued Sep. 1, 2010 in International Application No. PCT/US2010/040188.
Notification of Transmittal of the International Search Report and the Written Opinion of the International Searching Authority issued Aug. 20, 2010 in International Application No. PCT/US2010/040197.
Notification of Transmittal of the International Search Report and the Written Opinion of the International Searching Authority issued Apr. 14, 2011 in International Application No. PCT/US2011/023138.
Notification of Transmittal of the International Search Report and the Written Opinion of the International Searching Authority issued Aug. 17, 2011 in International Application No. PCT/US2011/033726.
Notification of Transmittal of the International Search Report and the Written Opinion of the International Searching Authority issued Sep. 27, 2011 in International Application No. PCT/US2011/038845.
Co-pending U.S. Appl. No. 13/266,486 titled High Performance Surface Mount Electrical Interconnect, filed Oct. 27, 2011.
Co-pending U.S. Appl. No. 13/266,522, titled Compliant Wafer Level Probe Assembly, filed Oct. 27, 2011.
Co-pending U.S. Appl. No. 13/266,573, titled Compliant Printed Circuit Area Array Semiconductor Device Package, filed Oct. 27, 2011.
Co-pending U.S. Appl. No. 13/266,907, titled Compliant Printed Circuit Socket Diagnostic Tool, filed Oct. 28, 2011.
Co-pending U.S. Appl. No. 13/318,038, titled Compliant Printed Circuit Wafer Probe Diagnostic Tool, filed Oct. 28, 2011.
Co-pending U.S. Appl. No. 13/318,171, titled Compliant Printed Circuit Peripheral Lead Semiconductor Test Socket, filed Oct. 31, 2011.
Co-pending U.S. Appl. No. 13/318,181, titled Compliant Printed Circuit Peripheral Lead Semiconductor Package, filed Oct. 31, 2011.
Co-pending U.S. Appl. No. 13/318,200, titled Compliant Printed Circuit Wafer Level Semiconductor Package, filed Oct. 31, 2011.
Co-pending U.S. Appl. No. 13/318,263, titled Compliant Printed Circuit Semiconductor Package, filed Oct. 31, 2011.
Co-pending U.S. Appl. No. 13/320,285, titled Compliant Printed Flexible Circuit, filed Nov. 14, 2011.
Co-pending U.S. Appl. No. 13/318,369, titled Composite Polymer-Metal Electrical Contacts, filed Nov. 1, 2011.
Co-pending U.S. Appl. No. 13/318,382, titled Resilient Conductive Electrical Interconnect, filed Nov. 1, 2011.
Co-pending U.S. Appl. No. 13/319,120, titled Simulated Wirebond Semiconductive Package, filed Nov. 7, 2011.
Co-pending U.S. Appl. No. 13/319,145, titled Semiconductor Die Terminal, filed Nov. 7, 2011.
Co-pending U.S. Appl. No. 13/319,158, titled Semiconductor Socket, filed Nov. 7, 2011.
Co-pending U.S. Appl. No. 13/319,203, titled Compliant Printed Circuit Semiconductor Test Interface, filed Nov. 7, 2011.
Co-pending U.S. Appl. No. 13/319,228, titled Singulated Semiconductor Device Separable Electrical Interconnect, filed Nov. 7, 2011.
Co-pending U.S. Appl. No. 13/410,914, titled Metalized Pad to Electrical Contact Interface, filed Mar. 2, 2012.
Co-pending U.S. Appl. No. 13/412,870, titled Selective Metalization of Electrical Connector or Socket Housing, filed Mar. 6, 2012.
Co-pending U.S. Appl. No. 13/413,032, titled Bumped Semiconductor Wafer or Die Level Electrical Interconnect, filed Mar. 6, 2012.
Co-pending U.S. Appl. No. 13/413,724, titled Copper Pillar Full Metal Via Electrical Circuit Structure, filed Mar. 7, 2012.
Notification of Transmittal of the International Search Report and the Written Opinion of the International Searching Authority mailed Feb. 8, 2012 in International Application No. PCT/US2011/0.
Notification of Transmittal of the International Search Report and the Written Opinion of the International Searching Authority mailed Mar. 26, 2012 in International Application No. PCT/US2011/062313.
Co-pending U.S. Appl. No. 13/418,853, titled High Performance Surface Mount Electrical Interconnect With External Biased Normal Force Loading, filed Mar. 13, 2012.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 3013 in co-pending U.S. Appl. No. 13/318,200, now published as US Patent Application Publication No. US 2012/0056332.
Amendment and Response filed Mar. 4, 2013 in co-pending U.S. Appl. No. 13/318,263, now published as US Patent Application Publication No. US 2012/0043667.
Co-pending U.S. Appl. No. 13/879,783 titled High Performance Electrical Circuit Structure, filed Apr. 16, 2013.
Co-pending U.S. Appl. No. 13/879,883 titled High Performance Surface Mount Electrical Interconnect, filed Apr. 17, 2013.

(56) References Cited

OTHER PUBLICATIONS

Co-pending U.S. Appl. No. 13/880,231 titled Electrical Interconnect IC Device Socket, filed Apr. 18, 2013.
Co-pending U.S. Appl. No. 13/880,461 titled Electrical Interconnect IC Device Socket, filed Apr. 19, 2013.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Review Decision mailed Apr. 2, 2014 in co-pending U.S. Appl. No. 13/318,038, now published as US Patent Application Publication No. US 2012/0062270.
Notice of Allowance and Fee(s) Due mailed Mar. 14, 2014 in co-pending U.S. Appl. No. 13/318,171, now published as US Patent Application Publication No. US 2012/0049877.
Office Action mailed Apr. 21, 2014 in co-pending U.S. Appl. No. 13/318,181, now published as US Patent Application Publication No. US 2012/0044659.
RCE filed Mar. 10, 2014 in co-pending U.S. Appl. No. 13/320,285, now published as US Patent Application Publication No. US 2012/0055702.
Amendment and Response filed Apr. 16, 2014 in co-pending U.S. Appl. No. 13/319,120 now published as US Patent Application Publication No. US 2012/0061851.
Restriction Requirement mailed Apr. 23, 2014 in co-pending U.S. Appl. No. 13/319,228, now published as US Patent Application Publication No. US 2012/0058653.
Office Action mailed Apr. 24, 2014 in co-pending U.S. Appl. No. 13/700,639, now published as US Patent Application Publication No. 2013/0078860.
Amendment and Response filed Mar. 17, 2014 in co-pending U.S. Appl. No. 13/410,914, now published as US Patent Application Publication No. US 2012/0164888.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Co-pending U.S. Appl. No. 14/254,038 titled High Performance Electrical Connector With Translated Insulator Contact Positioning, filed Apr. 16, 2014.
Liu, et al, "All-Polymer Capacitor Fabricated with Inkjet Printing Technique," Solid-State Electronics, vol. 47, pp. 1543-1548 (2003).
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 3, 2013 in International Application No. PCT/US2013/031395.
Restriction Requirement mailed Jun. 13, 2013 in co-pending U.S. Appl. No. 13/266,486, now published as US Patent Application Publication No. US 2012/0055701.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Examiner-Initiated Interview Summary mailed Mar. 14, 2013 in co-pending U.S. Appl. No. 13/319,228, now published as US Patent Application Publication No. US 2012/0058653.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Co-pending U.S. Appl. No. 13/575,368, titled High Speed Backplane Connector, filed Jul. 26, 2012.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Amendment and Response filed Jan. 3, 2014 in co-pending U.S. Appl. No. 13/266,907, now published as US Patent Application Publication No. US 2012/0268155.
Supplemental Amendment and Response filed Jan. 29, 2014 in co-pending U.S. Appl. No. 13/266,907, now published as US Patent Application Publication No. US 2012/0268155.
Office Action mailed Jan. 3, 2014 in co-pending U.S. Appl. No. 13/318,038, now published as US Patent Application Publication No. US 2012/0062270.
Office Action mailed Feb. 14, 2014 in co-pending U.S. Appl. No. 13/318,171, now published as US Patent Application Publication No. US 2012/0049877.
Amendment and Response filed Feb. 26, 2014 in co-pending U.S. Appl. No. 13/318,171, now published as US Patent Application Publication No. US 2012/0049877.
Response Restriction Requirement filed Jan. 28, 2014 in co-pending U.S. Appl. No. 13/318,181, now published as US Patent Application Publication No. US 2012/0044659.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.

(56) References Cited

OTHER PUBLICATIONS

Advisory Action mailed Feb. 26, 2014 in co-pending U.S. Appl. No. 13/320,285, now published as US Patent Application Publication No. US 2012/0055702.
Office Action mailed Jan. 17, 2014 in co-pending U.S. Appl. No. 13/319,120 now published as US Patent Application Publication No. US 2012/0061851.
Office Action mailed Dec. 26, 2013 in co-pending U.S. Appl. No. 13/319,145, now published as US Patent Application Publication No. 2012/0049342.
Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Feb. 27, 2014 in co-pending U.S. Appl. No. 13/319,203, now published as US Patent Application Publication No. 2012/0056640.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Allowance and Fee(s) Due mailed Feb. 26, 2014 in co-pending U.S. Appl. No. 13/412,870, now published as US Patent Application Publication No. US 2012/0171907.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Amendment and Response to Final Office filed Dec. 30, 2013 in co-pending U.S. Appl. No. 13/969,953, now published as US Patent Application Publication No. US 2013/0330942.
Notice of Allowance and Fee(s) Due mailed Jan. 22, 2014 in co-pending U.S. Appl. No. 13/969,953, now published as US Patent Application Publication No. US 2013/0330942.
Co-pending U.S. Appl. No. 14/238,638 titled Direct Metalization of Electrical Circuit Structure, filed Feb. 12, 2014.
Notice of Allowance and Fee(s) Due mailed Apr. 9, 2015 in co-pending U.S. Appl. No. 13/266,573, now issued as U.S. Pat. No. 9,054,097.
Notice of Allowance and Fee(s) Due mailed Apr. 13, 2015 in co-pending U.S. Appl. No. 13/318,200, now published as US Patent Application Publication No. US 2012/0056332.
Notice of Allowance and Fee(s) Due mailed May 18, 2015 in co-pending U.S. Appl. No. 14/086,029, now issued as U.S. Pat. No. 9,076,884.
Final Office Action mailed Jun. 30, 2015 in co-pending U.S. Appl. No. 13/318,369, now published as US Patent Application Publication No. US 2012/0043119.
Office Action mailed Apr. 23, 2015 in co-pending U.S. Appl. No. 13/319,158, now published as US Patent Application Publication No. 2012/0051016.
Office Action mailed Apr. 2, 2015 in co-pending U.S. Appl. No. 13/700,639, now published as US Patent Application Publication No. 2013/0078860.
Final Office Action mailed Apr. 23, 2015 in co-pending U.S. Appl. No. 13/879,783, now published as US Patent Application Publication No. 2013/0223034.
Notice of Allowance and Fee(s) Due mailed May 28, 2015 in co-pending U.S. Appl. No. 13/879,883, now published as US Patent Application Publication No. 2013/0244490.

Office Action mailed May 22, 2015 in co-pending U.S. Appl. No. 13/880,231, now published as US Patent Application Publication No. 2013/0210276.
Office Action mailed May 4, 2015 in co-pending U.S. Appl. No. 13/880,231, now published as US Patent Application Publication No. 2013/0210276.
Notice of Allowance and Fee(s) Due mailed Jun. 4, 2015 in co-pending U.S. Appl. No. 13/410,914, now published as US Patent Application Publication No. US 2012/0164888.
Notice of Allowance and Fee(s) Due mailed Nov. 24, 2014 in co-pending U.S. Appl. No. 13/266,486, now published as US Patent Application Publication No. US 2012/0055701.
Supplemental Notice of Allowance mailed Dec. 24, 2014 in co-pending U.S. Appl. No. 13/266,486, now published as US Patent Application Publication No. US 2012/0055701.
Supplemental Notice of Allowance mailed Dec. 19, 2014 in co-pending U.S. Appl. No. 13/318,181, now published as US Patent Application Publication No. US 2012/0044659.
Office Action mailed Nov. 19, 2014 in co-pending U.S. Appl. No. 13/318,200, now published as US Patent Application Publication No. US 2012/0056332.
Office Action mailed Nov. 14, 2014 in co-pending U.S. Appl. No. 13/318,369, now published as US Patent Application Publication No. US 2012/0043119.
Amendment and Response and Terminal Disclaimer filed Nov. 14, 2014 in co-pending U.S. Appl. No. 13/318,382, now published as US Patent Application Publication No. US 2012/0043130.
Notice of Allowance and Fee(s) Due mailed Dec. 19, 2014 in co-pending U.S. Appl. No. 13/319,145 now published as US Patent Application Publication No. US 2012/0049342.
Amendment and Response Under Rule 1.116 and Request After Final Consideration Program 2.0 filed Dec. 18, 2014 in co-pending U.S. Appl. No. 13/319,158, now published as US Patent Application Publication No. 2012/0051016.
Advisory Action mailed Jan. 2, 2015 in co-pending U.S. Appl. No. 13/319,158, now published as US Patent Application Publication No. 2012/0051016.
Request for Continued Examination filed Nov. 12, 2014 in co-pending U.S. Appl. No. 13/319,203, now published as US Patent Application Publication No. 2012/0056640.
Notice of Allowance and Fee(s) Due mailed Dec. 10, 2014 in co-pending U.S. Appl. No. 13/319,203, now published as US Patent Application Publication No. 2012/0056640.
Amendment and Response and Terminal Disclaimer filed Nov. 17, 2014 in co-pending U.S. Appl. No. 13/319,228, now published as US Patent Application Publication No. US 2012/0058653.
Notice of Allowance and Fee(s) Due mailed Jan. 13, 2015 in co-pending U.S. Appl. No. 13/319,228, now published as US Patent Application Publication No. US 2012/0058653.
Amendment and Response filed Nov. 19, 2014 in co-pending U.S. Appl. No. 13/643,436, now published as US Patent Application Publication No. 2013/0105984.
Response Under Rule 1.116 filed Nov. 11, 2014 in co-pending U.S. Appl. No. 13/700,639, now published as US Patent Application Publication No. 2013/0078860.
Amendment and Response and RCE filed Dec. 30, 2014 in co-pending U.S. Appl. No. 13/700,639, now published as US Patent Application Publication No. 2013/0078860.
Advisory Action mailed Dec. 3, 2014 in co-pending U.S. Appl. No. 13/700,639, now published as US Patent Application Publication No. 2013/0078860.
Office Action mailed Nov. 17, 2014 in co-pending U.S. Appl. No. 13/879,883, now published as US Patent Application Publication No. 2013/0244490.
Office Action mailed Dec. 26, 2014 in co-pending U.S. Appl. No. 13/410,914, now published as US Patent Application Publication No. US 2012/0164888.
Restriction Requirement mailed Nov. 19, 2014 in co-pending U.S. Appl. No. 13/413,032, now published as US Patent Application Publication No. US 2012/0182035.
Response to Restriction Requirement filed Nov. 20, 2014 in co-pending U.S. Appl. No. 13/413,032, now published as US Patent Application Publication No. US 2012/0182035.

(56) References Cited

OTHER PUBLICATIONS

Notice of Allowance and Fee(s) Due mailed Jan. 5, 2015 in co-pending U.S. Appl. No. 13/413,032, now published as US Patent Application Publication No. US 2012/0182035.
Co-pending U.S. Appl. No. 14/408,205 titled Hybrid Printed Circuit Assembly With Low Density Main Core and Embedded High Density Circuit Regions, filed Dec. 15, 2014.
Co-pending U.S. Appl. No. 14/408,039 titled High Speed Circuit Assembly With Integral Terminal and Mating Bias Loading Electrical Connector Assembly, filed Dec. 15, 2014.
Co-pending U.S. Appl. No. 14/408,338 titled Semiconductor Socket With Direct Selective Metalization, filed Dec. 16, 2014.
Co-pending U.S. Appl. No. 14/565,724 titled Performance Enhanced Semiconductor Socket, filed Dec. 10, 2014.
Notification of Transmittal of the International Search Report and the Written Opinion of the International Searching Authority mailed Oct. 27, 2014 in International Application No. PCT/US2014/045856.
Ex Parte Quayle Action mailed Oct. 1, 2014 in co-pending U.S. Appl. No. 13/266,486, now published as US Patent Application Publication No. US 2012/0055701.
Amendment and Response After ExParte Quayle Action filed Oct. 6, 2014 in co-pending U.S. Appl. No. 13/266,486, now published as US Patent Application Publication No. US 2012/0055701.
Notice of Non-Compliant Amendment mailed Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Amendment and Response filed Sep. 9, 2014 in co-pending U.S. Appl. No. 13/266,573, now published as US Patent Application Publication No. 2012/0061846.
Notice of Allowance and Fee(s) Due mailed Oct. 8, 2014 in co-pending U.S. Appl. No. 13/266,907, now published as US Patent Application Publication No. US 2012/0268155.
Amendment and Response Under Rule 1.116 and Termination Disclaimer filed Sep. 4, 2014 in co-pending U.S. Appl. No. 13/318,038, now published as US Patent Application Publication No. US 2012/0062270.
Terminal Disclaimer Review Decision mailed Sep. 8, 2014 in co-pending U.S. Appl. No. 13/318,038, now published as US Patent Application Publication No. US 2012/0062270.
Notice of Allowance and Fee(s) Due mailed Sep. 30, 2014 in co-pending U.S. Appl. No. 13/318,038, now published as US Patent Application Publication No. US 2012/0062270.
Notice of Allowance and Fee(s) Due mailed Oct. 24, 2014 in co-pending U.S. Appl. No. 13/318,181, now published as US Patent Application Publication No. US 2012/0044659.
Amendment and Response and Examiner's Interview Summary filed Oct. 15, 2014 in co-pending U.S. Appl. No. 13/320,285, now published as US Patent Application Publication No. US 2012/0055702.
Restriction Requirement mailed Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Applicant-Initiated Interview Summary mailed Sep. 12, 2014 in co-pending U.S. Appl. No. 13/319,120 now published as US Patent Application Publication No. US 2012/0061851.
Amendment and Response and RCE filed Oct. 1, 2014 in co-pending U.S. Appl. No. 13/319,120 now published as US Patent Application Publication No. US 2012/0061851.
Notice of Allowance and Fee(s) Due mailed Oct. 27, 2014 in co-pending U.S. Appl. No. 13/319,120 now published as US Patent Application Publication No. US 2012/0061851.
Applicant-Initiated Interview Summary mailed Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Final Office Action mailed Nov. 6, 2014 in co-pending U.S. Appl. No. 13/319,158, now published as US Patent Application Publication No. 2012/0051016.
Amendment and Response Under Rule 1.116 filed Oct. 2, 2014 in co-pending U.S. Appl. No. 13/319,203, now published as US Patent Application Publication No. 2012/0056640.
Applicant-Initiated Interview Summary mailed Oct. 9, 2014 in co-pending U.S. Appl. No. 13/319,203, now published as US Patent Application Publication No. 2012/0056640.
Advisory Action mailed Oct. 16, 2014 in co-pending U.S. Appl. No. 13/319,203, now published as US Patent Application Publication No. 2012/0056640.
Notice of Abandonment mailed Oct. 10, 2014 in co-pending U.S. Appl. No. 13/575,368, now published as US Patent Application Publication No. 2013/0203273.
Office Action mailed Sep. 17, 2014 in co-pending U.S. Appl. No. 13/643,436, now published as US Patent Application Publication No. 2013/0105984.
Final Office Action mailed Sep. 8, 2014 in co-pending U.S. Appl. No. 13/700,639, now published as US Patent Application Publication No. 2013/0078860.
Office Action mailed Oct. 6, 2014 in co-pending U.S. Appl. No. 13/879,783, now published as US Patent Application Publication No. 2013/0223034.
Amendment and Response and RCE filed Sep. 30, 2014 in co-pending U.S. Appl. No. 13/410,914, now published as US Patent Application Publication No. US 2012/0164888.
Final Office Action mailed Oct. 28, 2014 in co-pending U.S. Appl. No. 13/418,853, now published as US Patent Application Publication No. US 2012/0244728.
Print—Definition of Print by The Free Dictionary, http://www.thefreedictionary.com/print, Aug. 13, 2014.
Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Office Action mailed Jul. 3, 2014 in co-pending U.S. Appl. No. 13/266,573, now published as US Patent Application Publication No. 2012/0061846.
Amendment and Response Under Rule 1.116 mailed Jul. 10, 2014 in co-pending U.S. Appl. No. 13/266,907, now published as US Patent Application Publication No. US 2012/0268155.
Advisory Action mailed Jul. 25, 2014 in co-pending U.S. Appl. No. 13/266,907, now published as US Patent Application Publication No. US 2012/0268155.
Advisory Action mailed Aug. 8, 2014 in co-pending U.S. Appl. No. 13/266,907, now published as US Patent Application Publication No. US 2012/0268155.
Amendment and Response to Final Office Action and RCE filed Aug. 26, 2014 in co-pending U.S. Appl. No. 13/266,907, now published as US Patent Application Publication No. US 2012/0268155.
Final Office Action mailed Aug. 1, 2014 in co-pending U.S. Appl. No. 13/318,038, now published as US Patent Application Publication No. US 2012/0062270.
Amendment and Response filed Jul. 27, 2014 in co-pending U.S. Appl. No. 13/318,181, now published as US Patent Application Publication No. US 2012/0044659.
Office Action mailed Jul. 29, 2014 in co-pending U.S. Appl. No. 13/320,285, now published as US Patent Application Publication No. US 2012/0055702.

(56) References Cited

OTHER PUBLICATIONS

Final Office Action mailed Jul. 31, 2014 in co-pending U.S. Appl. No. 13/319,120, now published as US Patent Application Publication No. US 2012/0055702.
Office Action mailed Aug. 26, 2014 in co-pending U.S. Appl. No. 13/318,382, now published as US Patent Application Publication No. US 2012/0043130.
Final Office Action mailed Aug. 4, 2014 in co-pending U.S. Appl. No. 13/319,145, now published as US Patent Application Publication No. 2012/0049342.
Amendment and Response filed Sep. 3, 2014 in co-pending U.S. Appl. No. 13/319,158, now published as US Patent Application Publication No. 2012/0051016.
Final Office Action mailed Aug. 20, 2014 in co-pending U.S. Appl. No. 13/319,203, now published as US Patent Application Publication No. 2012/0056640.
Office Action mailed Sep. 4, 2014 in co-pending U.S. Appl. No. 13/319,228, now published as US Patent Application Publication No. US 2012/0058653.
Amendment and Response filed Jul. 30, 2014 in co-pending U.S. Appl. No. 13/700,639, now published as US Patent Application Publication No. 2013/0078860.
Response to Restriction Requirement filed Jul. 17, 2014 in co-pending U.S. Appl. No. 13/879,783, now published as US Patent Application Publication No. 2013/0223034.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Amendment and Response filed Aug. 26, 2014 in co-pending U.S. Appl. No. 13/418,853, now published as US Patent Application Publication No. US 2012/0244728.
Co-pending U.S. Appl. No. 14/327,916 titled Matrix Defined Electrical Circuit Structure, filed Jul. 10, 2014.
Final Office Action mailed May 15, 2014 in co-pending U.S. Appl. No. 13/266,486, now published as US Patent Application Publication No. US 2012/0055701.
Notice of Allowance and Fee(s) Due mailed May 2, 2014 in co-pending U.S. Appl. No. 13/266,522, now published as US Patent Application Publication No. 2012/0068727.
Final Office Action mailed May 7, 2014 in co-pending U.S. Appl. No. 13/266,907, now published as US Patent Application Publication No. US 2012/0268155.
Amendment and Response filed Mar. 18, 2014 in co-pending U.S. Appl. No. 13/319,145, now published as US Patent Application Publication No. 2012/0049342.
Office Action mailed Jun. 27, 2014 in co-pending U.S. Appl. No. 13/319,158, now published as US Patent Application Publication No. 2012/0051016.
Amendment and Response file Jun. 10, 2014 in co-pending U.S. Appl. No. 13/319,203, now published as US Patent Application Publication No. 2012/0056640.
Response to Restriction Requirement filed Jun. 23, 2014 in co-pending U.S. Appl. No. 13/319,228, now published as US Patent Application Publication No. US 2012/0058653.
Restriction Requirement mailed Jun. 5, 2014 in co-pending U.S. Appl. No. 13/879,783, now published as US Patent Application Publication No. 2013/0223034.
Final Office Action mailed Jun. 4, 2014 in co-pending U.S. Appl. No. 13/410,914, now published as US Patent Application Publication No. US 2012/0164888.
Notice of Allowance and Fee(s) Due mailed May 9, 2014 in co-pending U.S. Appl. No. 13/413,724, now published as US Patent Application Publication No. US 2012/0168948.
Response to Restriction Requirement filed Apr. 23, 2014 in co-pending U.S. Appl. No. 13/418,853, now published as US Patent Application Publication No. US 2012/0244728.

Office Action mailed Jun. 26, 2014 in co-pending U.S. Appl. No. 13/418,853, now published as US Patent Application Publication No. US 2012/0244728.
Response to Restriction Requirement filed Jul. 15, 2013 in co-pending U.S. Appl. No. 13/266,486, now published as US Patent Application No. US 2012/0055701.
Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance and Fee(s) Due mailed Jul. 17, 2013 in co-pending U.S. Appl. No. 13/448,914, now published as US Patent Application Publication No. US 2012/0202364.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Sep. 16, 2013 in co-pending U.S. Appl. No. 13/413,724, now published as US Patent Application Publication No. US 2012/0168948.
Restriction Requirement mailed Sep. 26, 2013 in co-pending U.S. Appl. No. 13/319,120 now published as US Patent Application Publication No. US 2012/0061851.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl. No. 13/266,573, now published as US Patent Application Publication No. 2012/0061846.
Restriction Requirement mailed Oct. 1, 2013 in co-pending U.S. Appl. No. 13/319,145, now published as US Patent Application Publication No. 2012/0049342.
Co-pending U.S. Appl. No. 13/969,953 titled Compliant Conductive Nano-Particle Electrical Interconnect, filed Aug. 19, 2013.
Notification of Transmittal of the International Search Report and the Written Opinion of the International Searching Authority mailed Apr. 5, 2012 in International Application No. PCT/US2011/062321.
Notification of Transmittal of the International Search Report and the Written Opinion of the International Searching Authority mailed Mar. 29, 2012 in International Application No. PCT/US2011/063247.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Co-pending U.S. Appl. No. 13/448,865, titled Compliant Conductive Nano-Particle Electrical Interconnect, filed Apr. 17, 2012.
Co-pending U.S. Appl. No. 13/448,914, titled Compliant Core Peripheral Lead Semiconductor Test Socket, filed Apr. 17, 2012.

(56) References Cited

OTHER PUBLICATIONS

Final Office Action mailed Mar. 16, 2015 in co-pending U.S. Appl. No. 13/320,285, now published as US Patent Application Publication No. US 2012/0055702.
Final Office Action mailed Feb. 10, 2015 in co-pending U.S. Appl. No. 13/318,382, now published as US Patent Application Publication No. US 2012/0043130.
Amendment and Response with RCE filed Feb. 5, 2015 in co-pending U.S. Appl. No. 13/319,158, now published as US Patent Application Publication No. 2012/0051016.
Notice of Allowance and Fee(s) Due mailed Feb. 9, 2015 in co-pending U.S. Appl. No. 13/643,436, now published as US Patent Application Publication No. 2013/0105984.
Restriction Requirement mailed Feb. 12, 2015 in co-pending U.S. Appl. No. 13/700,639, now published as US Patent Application Publication No. 2013/0078860.
Response to Restriction Requirement filed Feb. 24, 2015 in co-pending U.S. Appl. No. 13/700,639, now published as US Patent Application Publication No. 2013/0078860.
Amendment and Response filed Feb. 3, 2015 in co-pending U.S. Appl. No. 13/879,783, now published as US Patent Application Publication No. 2013/0223034.
Amendment and Response filed Mar. 10, 2015 in co-pending U.S. Appl. No. 13/879,883, now published as US Patent Application Publication No. 2013/0244490.
Restriction Requirement mailed Jan. 22, 2015 in co-pending U.S. Appl. No. 13/880,231, now published as US Patent Application Publication No. 2013/0210276.
Response to Restriction Requirement filed Jan. 27, 2015 in co-pending U.S. Appl. No. 13/880,231, now published as US Patent Application Publication No. 2013/0210276.
Amendment and Response with RCE filed Jan. 28, 2015 in co-pending U.S. Appl. No. 13/418,853, now published as US Patent Application Publication No. US 2012/0244728.
Office Action mailed Feb. 20, 2015 in co-pending U.S. Appl. No. 13/418,853, now published as US Patent Application Publication No. US 2012/0244728.
Co-pending U.S. Appl. No. 14/621,663 titled High Performance Surface Mount Electrical Interconnect, filed Feb. 13, 2015.

\* cited by examiner

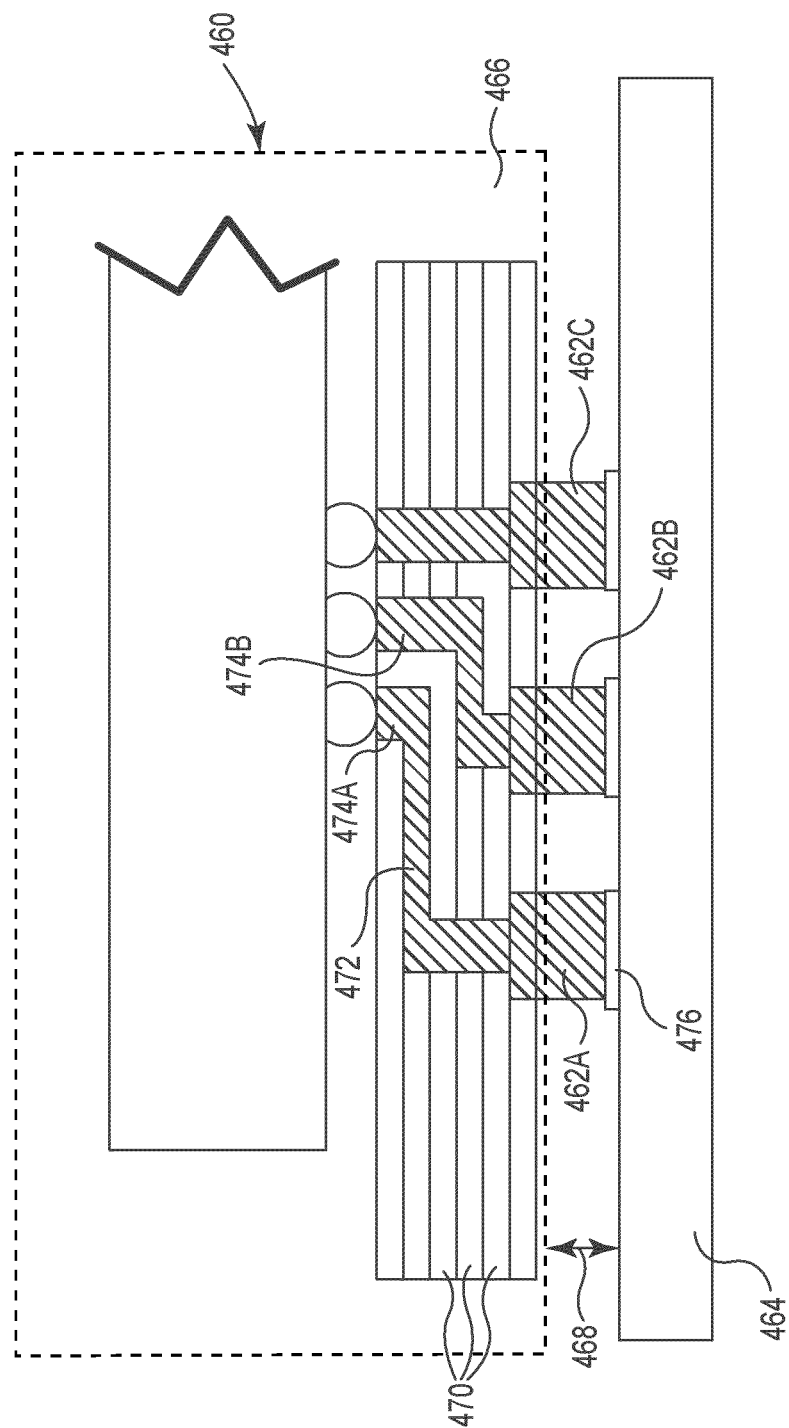

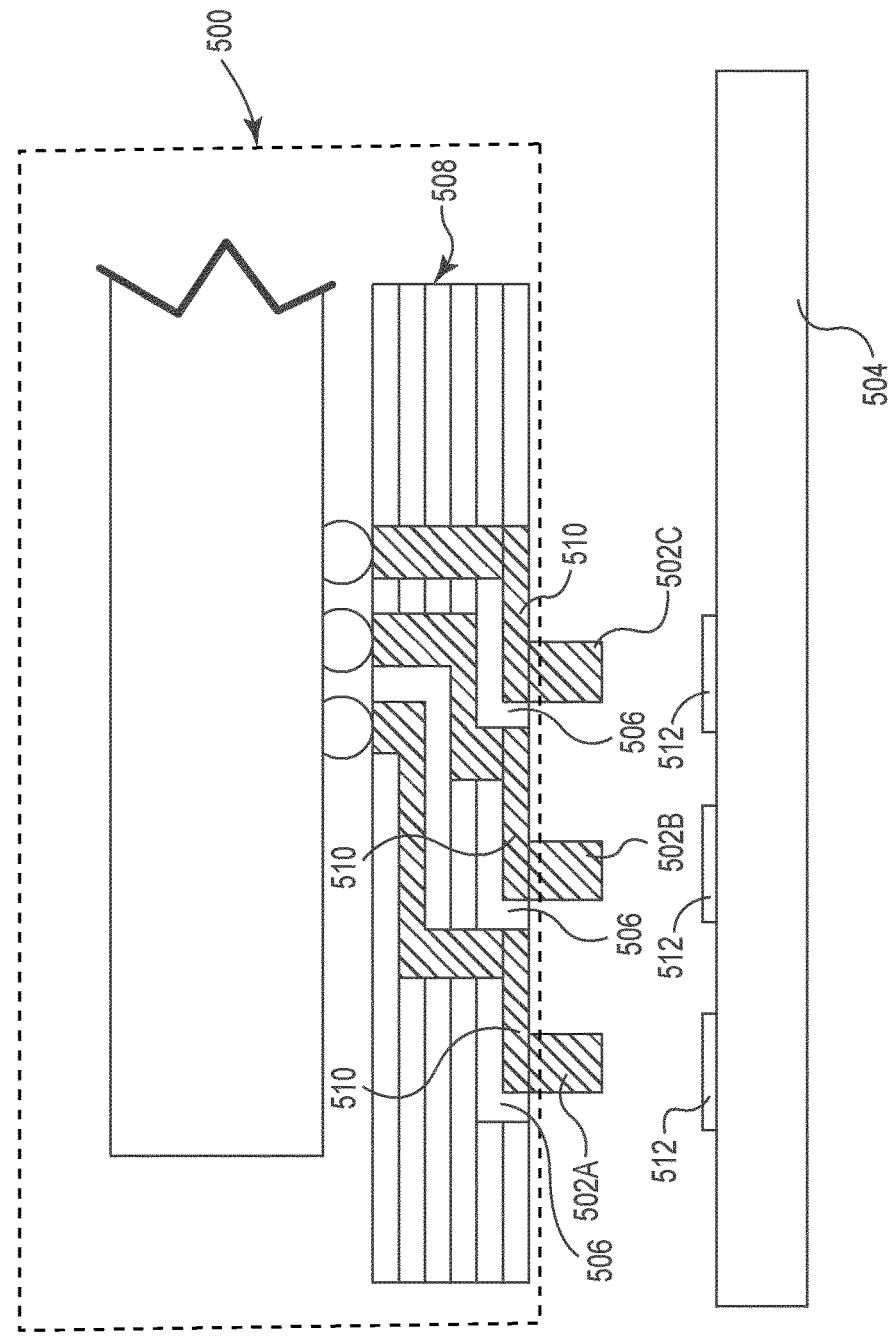

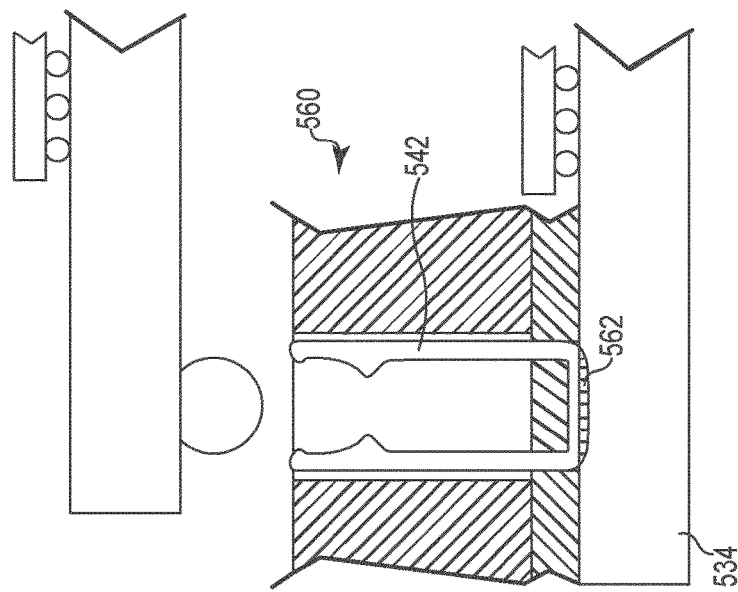
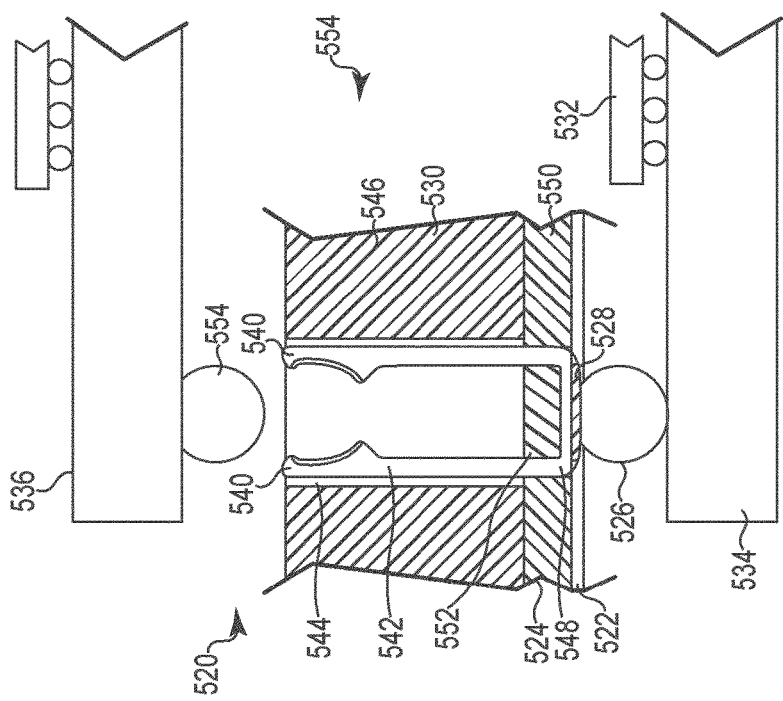
Fig. 23B
Fig. 23A

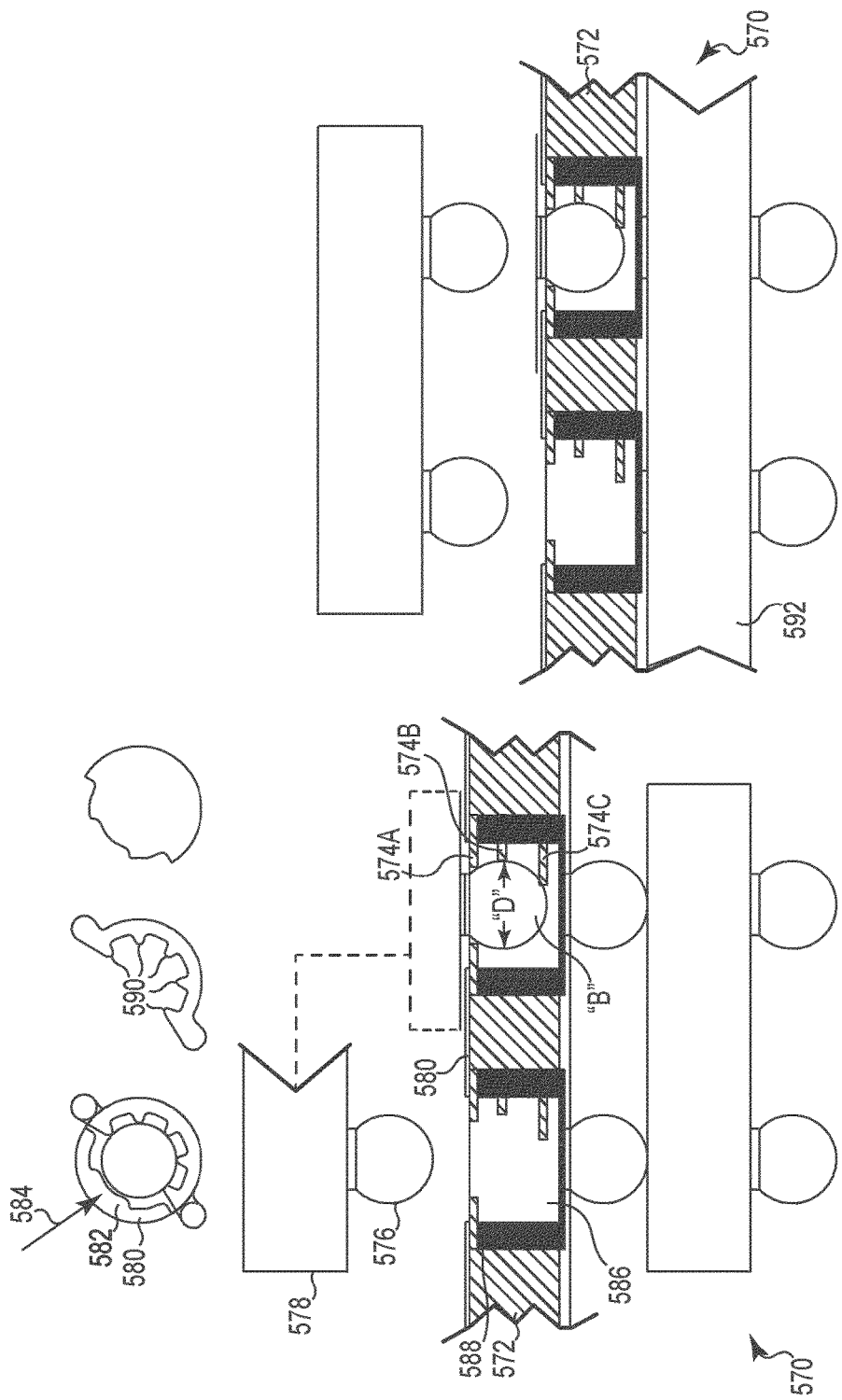

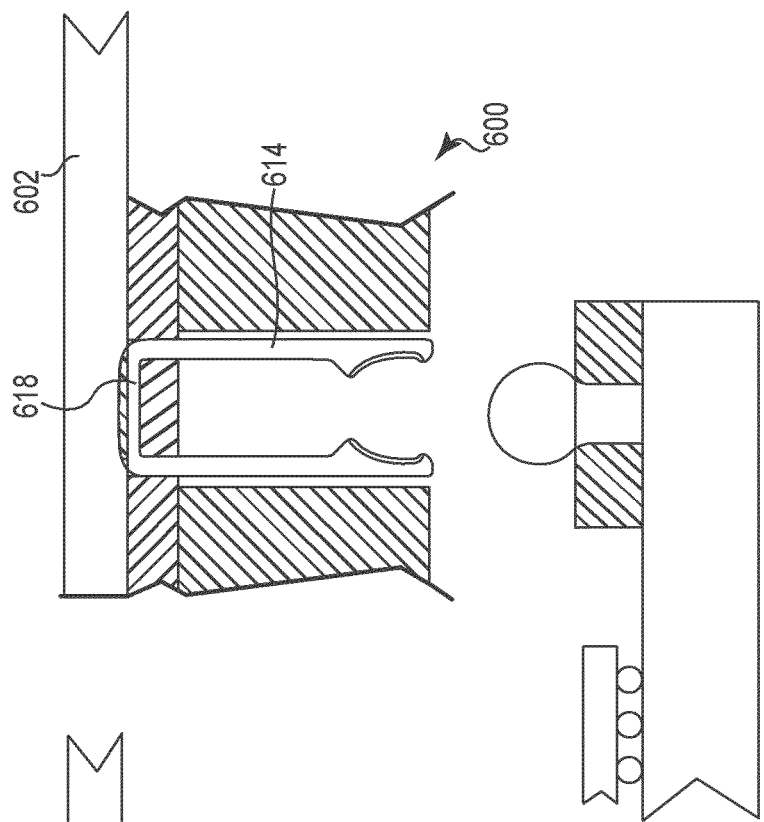
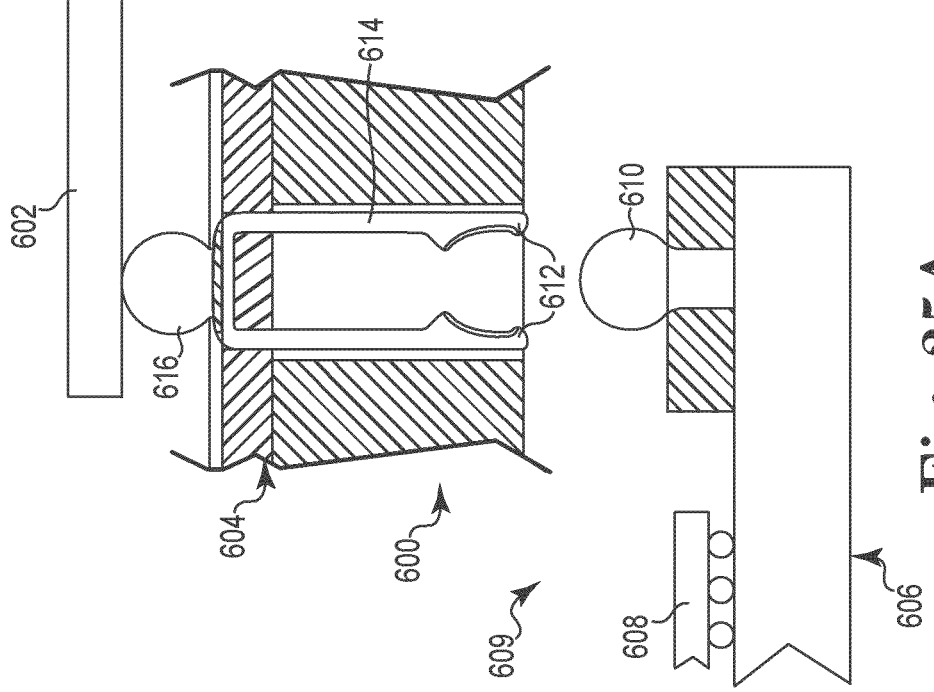
Fig. 25A
Fig. 25B

AREA ARRAY SEMICONDUCTOR DEVICE PACKAGE INTERCONNECT STRUCTURE WITH OPTIONAL PACKAGE-TO-PACKAGE OR FLEXIBLE CIRCUIT TO PACKAGE CONNECTION

This application claims the benefit of U.S. Provisional Application No. 61/448,282, filed Mar. 2, 2011, the disclosure of which is hereby incorporated by reference.

This application is a continuation-in-part of U.S. patent application Ser. No. 13/266,573, titled COMPLIANT PRINTED CIRCUIT AREA ARRAY SEMICONDUCTOR DEVICE PACKAGE, filed Oct. 27, 2011, which is a national stage application under 35 U.S.C.§371 of International Application No. PCT/US2010/036363, titled COMPLIANT PRINTED CIRCUIT AREA ARRAY SEMICONDUCTOR DEVICE PACKAGE, filed May 27, 2010, which claims priority to U.S. Provisional Application No. 61/183,411, filed Jun. 2, 2009, all of which are hereby incorporated by reference in their entireties.

This application is a continuation-in-part of U.S. patent application Ser. No. 13/318,200, title COMPLIANT PRINTED CIRCUIT WAFER LEVEL SEMICONDUCTOR PACKAGE, filed Oct. 31, 2011, which is a national stage application under 35 U.S.C.§371 of International Application No. PCT/US2010/036288, titled COMPLIANT PRINTED CIRCUIT WAFER LEVEL SEMICONDUCTOR PACKAGE, filed May 27, 2010, which claims priority to U.S. Provisional Application No. 61/183,356, filed Jun. 2, 2009, all of which are hereby incorporated by reference in their entireties.

This application is a continuation-in-part of U.S. patent application Ser. No. 13/318,263, title COMPLIANT PRINTED CIRCUIT SEMICONDUCTOR PACKAGE, filed Oct. 31, 2011, which is a national stage application under 35 U.S.C.§371 of International Application No. PCT/US2010/036285, titled COMPLIANT PRINTED CIRCUIT SEMICONDUCTOR PACKAGE, filed May 27, 2010, which claims priority to U.S. Provisional Application No. 61/183,348, filed Jun. 2, 2009, all of which are hereby incorporated by reference in their entireties.

The present application is a continuation-in-part of International Application No. PCT/US2011/033726, titled SEMICONDUCTOR DEVICE PACKAGE ADAPTER, filed Apr. 25, 2011, which claims the benefit of U.S. Provisional Application No. 61/327,795, entitled Semiconductor Device Package Adapter, filed Apr. 26, 2010, which are hereby incorporated by reference in their entireties.

The present application is a continuation-in-part of International Application No. PCT/US2011/062313, titled HIGH PERFORMANCE SURFACE MOUNT ELECTRICAL INTERCONNECT, filed Nov. 29, 2011, which claims the benefit of U.S. Provisional Application No. 61/418,625, filed Dec. 1, 2010, which are hereby incorporated by reference in their entireties.

TECHNICAL FIELD

The present disclosure is directed to an area array IC device package capable of package-to-package or package-to-flex connection. Various package-to-package structures are also disclosed. The present disclosure also discloses the use of unique fabrication techniques that merge processes used in the printed circuit and semiconductor packaging industries with the flexibility of additive printing technology to make the present array package.

BACKGROUND OF THE INVENTION

Traditional semiconductors and IC devices are typically packaged in a variety of ways to provide redistribution from the terminals on the die to a spacing that is conducive to cost effective printed circuit board ("PCB") fabrication techniques. In many cases, the size and distance between die terminals is so small that the device cannot be connected to the final PCB without some sort of fan out or routing. The packages also serve to protect the fragile silicon or provide additional functions such as thermal management or near device decoupling. In many cases, the size and distance between die terminals is so small that the IC device cannot be connected to the final PCB without some sort of re-routing interface.

Most IC devices are produced with terminals in either a peripheral pattern that runs along the edges of the device or an area array pattern that spans across the surface of the device. A main method for attachment when the terminals are in an area array pattern is to connect the terminals with solder. Basically, the package has a field of terminals that correspond to the IC device terminals. Solder is applied to one or both of the terminals and reflowed to create the mechanical and electrical connection in a process commonly called flip chip attachment, since the IC device is flipped over to mate the terminals on the die to the terminals on the IC package substrate.

The IC devices in these types of packages are often under-filled with an epoxy of some type to provide support and strength to the joints so they remain connected during use and do not break due to thermal expansion mis-match or shock. In both cases, the connection of the device to the package is generally not reworkable once packaged and if there is a missing or broken connection it is difficult to repair.

There also has been advancements in recent years in both package types where multiple devices are placed in the same package, creating what has been nicknamed SiP or system-in-package. Once the IC devices are packaged, the IC devices are usually tested in a variety of ways to determine the reliability and performance of the devices in the package as they would be used in the final application. In many cases, the functional performance of the device is not known prior to placing it into the package and if the packaged device fails testing the cost of the package and processing is lost.

Area array packaging has been utilized for many years, and provides a method for interconnecting devices with larger terminal counts than peripheral lead packaging. In general, the area array packaging is more expensive due to the larger pin counts and more sophisticated substrates required. The main limitations for area array packaging are the terminal pitch, thermal management, cost, ability to rework faulty devices and reliability of the solder joint.

As IC devices advance to next generation architectures traditional area array packages have reached mechanical and electrical limitations that require alternate methods. For example, increased terminal count, reduction in the distance between the contacts known as terminal pitch, and signal integrity have been the main drivers that impact area array package design. As terminal counts go up, the area array package essentially gets larger due to the additional space needed for the terminals. As the package grows larger, costs go up and the relative flatness of the package and corresponding PCB require compliance between the contact members in the area array package and the terminal pad to accommodate the topography differences and maintain reliable connection.

BRIEF SUMMARY OF THE INVENTION

The present disclosure is directed to an area array IC device package capable of package-to-package or package-to-flex connection. The present disclosure also discloses the use of unique fabrication techniques that merge processes used in the printed circuit and semiconductor packaging industries with the flexibility of additive printing technology to make the present array package.

The present disclosure leverages the capabilities of the additive printing process to provide an area array IC package capable of interconnecting a single device or multiple IC devices, while providing at or near terminal compliance to increase interconnect reliability. The unique nature of the additive printing process allows for a direct writing of circuitry and dielectrics, with the added benefit of stress decoupling at the terminal joints as well as embedded function not seen in traditional IC packaging. The additive printing process allows for packaging that provides very high frequency performance, as well as the addition of on-board electrical devices and circuitry planes that are not available with other IC packages.

The use of additive printing processes permits the material set in a given layer to vary. Traditional PCB and circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

The production cost for the IC packages in accordance with the present disclosure can be a fraction the cost of producing existing IC packages. The use of additive printing processes, such as for example to print electrical features, can reduce capital cost and lead time for building the present IC packages. The additive printing processes also increase production yields over conventional IC packages that rely on conventional lithography tools and masks.

Once the substrate of the interconnect is loaded with contacts it can be treated as a printed circuit or semiconductor package to add function and electrical enhancements not found in traditional connectors. The ability to enhance the interconnect portion of the IC package allows for reductions in complexity for the package and the PCB, while improving the overall performance of the interconnect and system.

The contact members are inserted into openings in the interconnect substrate. In some embodiments, no contact retention features are required, greatly reducing the complexity of the component and the tooling required to produce them. Furthermore, reflow of the solder is not necessary for the contact members to retain the solder balls.

The present disclosure also merges the long-term performance advantages of traditional PCB and semiconductor packaging with the flexibility of additive printing technology. By combining methods used in the PCB fabrication and semiconductor packaging industries, the present disclosure enables fine line high density circuit structures with attractive cost of manufacture.

The present IC package can be treated as a system of its own by incorporating electrical devices or other passive and active function, such as for example, ground planes, power planes, electrical connections to other circuit members, dielectric layers, conductive traces, transistors, capacitors, resistors, RF antennae, shielding, filters, signal or power altering and enhancing devices, memory devices, embedded IC, and the like. In some embodiments, the electrical devices can be formed using printing technology, adding intelligence to the interconnect assembly.

The present IC package can be produced digitally, without tooling or costly artwork. The high performance electrical interconnect can be produced as a "Green" product, with dramatic reductions in environmental issues related to the production of conventional flexible circuits.

The use of additive printing processes permits the material set in a given layer to vary. Traditional PCB and flex circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

At least one electrical device is optionally printed on a dielectric layer and electrically coupled to at least a portion of the circuit geometry. Optical quality materials can be printed or deposited in at least a portion of the recesses to form optical circuit geometries. Alternatively, optical fibers can be located in the recesses.

The printing process permits the fabrication of functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

The present disclosure is directed to an area array integrated circuit (IC) package for an IC device. The IC package includes a first substrate with conductive traces electrically coupled to the IC device. An interconnect assembly having a first surface is mechanically coupled to the first substrate. The interconnect assembly includes a plurality of contact members electrically coupled to the conductive traces on the first substrate. A second substrate is mechanically coupled to a second surface of the interconnect assembly so that the first substrate, the interconnect assembly, and the second substrate substantially surround the IC device. The second substrate includes conductive traces that are electrically coupled to the contact members in the interconnect assembly.

The second substrate can be a PCB, a flexible circuit, a packaged IC device, or another IC package.

In one embodiment, the interconnect assembly includes a housing with a plurality of recesses containing the contact members. The contact members are arranged to electrically couple with the conductive traces on the first or second substrates. The contact members optionally include a pair of contact beams configured to deflect outward during insertion of solder balls attached to, and electrically coupled with, the conductive traces on the first or second substrates. The beams retract inward to mechanically engage the solder balls. The recesses in the housing are configured to permit outward deflection of the contact beams and to limit over deflection of the contact beams.

In another embodiment, the interconnect assembly includes a housing with a first surface, a second surface, and a plurality of openings sized and configured to receive solder balls attached to, and electrically coupled with, the conductive traces on the first or second substrates. A plurality of electrically conductive contact tabs are bonded to the first surface of the housing so that contact tips on the contact tabs extend into the openings. The contact tips electrically couple with the first or second substrates when the solder balls are positioned in the openings. Vias located in the openings electrically couple the contact tabs to contact pads located proximate the second surface of the housing. A optional dielectric layer on the first surface of the substrate extends into the openings to mechanically engage with the solder balls.

In one embodiment, the interconnect assembly is a layered structure wherein one of the layers is a circuitry plane selected from one of a ground plane, a power plane, an electrical connection to other circuit members, a dielectric layer, or a flexible circuit. In another embodiment, an optical quality material located between the layers is optically coupled to the IC device. Printed electrical device are optionally located on the interconnect assembly and electrically coupled to at least a one of the contact members.

The interconnect assembly is preferably a surface mount device attached to the first substrate using surface mount technology. In one embodiment, the interconnect assembly includes at least one circuit trace that electrically couples the contact member to metalized pads located along a second surface of the interconnect assembly at a location offset from a corresponding contact member.

The present disclosure is also directed to a method of making an area array integrated circuit (IC) package for an IC device. The method includes the steps of electrically coupling the IC device to conductive traces on a first substrate; mechanically coupling a first surface of an interconnect assembly to the first substrate; electrically coupling contact members in the interconnect assembly to the conductive traces on the first substrate; mechanically coupling a second substrate to a second surface of the interconnect assembly so that the first substrate, the interconnect assembly, and the second substrate substantially surround the IC device; and electrically coupling conductive traces on the second substrate to the contact members in the interconnect assembly.

BRIEF DESCRIPTION OF THE SEVERAL VIEWS OF THE DRAWING

FIG. 21 is a cross-sectional view of an alternate area array IC package with additional electrical functionality in accordance with an embodiment of the present disclosure.

FIG. 22 is area array IC packages with additional compliance in accordance with an embodiment of the present disclosure.

FIGS. 23A and 23B are side sectional views of a package-to-package structure in accordance with an embodiment of the present disclosure.

FIGS. 24A and 24B are side sectional views of alternate package-to-package structure with a multiple layer electrical interconnect in accordance with an embodiment of the present disclosure.

FIGS. 25A and 25B are side sectional views of alternate package-to-package structure coupled to a flexible circuit in accordance with an embodiment of the present disclosure.

DETAILED DESCRIPTION OF THE INVENTION

A high performance IC package according to the present disclosure may permit fine contact-to-contact spacing (pitch) on the order of less than 1.0 mm pitch, and more preferably a pitch of less than about 0.7 millimeter, and most preferably a pitch of less than about 0.4 millimeter. Such fine pitch high performance IC packages are especially useful for communications, wireless, and memory devices.

The present IC package can be configured as a low cost, high signal performance electrical interconnect, which has a low profile that is particularly useful for desktop and mobile PC applications. IC devices can be installed and uninstalled without the need to reflow solder. The solder-free electrical connection of the IC devices is environmentally friendly.

Figure 1:
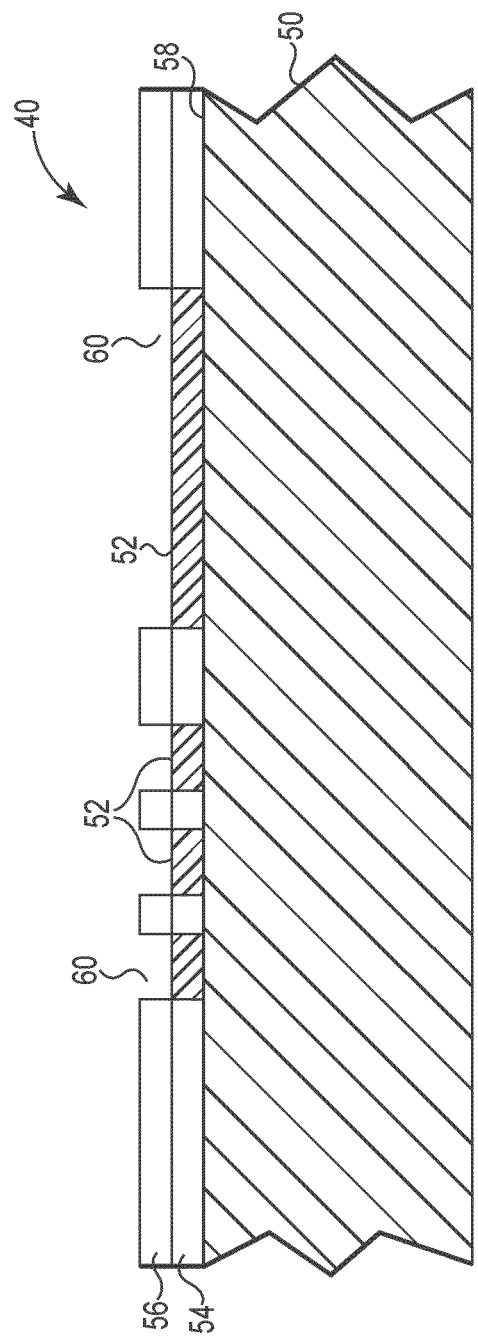
FIG. 1 is a cross-sectional view of a method of making an electrical interconnects for an IC package in accordance with an embodiment of the present disclosure.

FIG. 1 is a side cross-sectional view of a method of making an electrical interconnect 40 using additive processes for use in an IC package in accordance with an embodiment of the present disclosure. The process starts similar to a traditional PCB with a first circuitry layer 52 laminated to a stiffening layer or core 50, such as glass-reinforced epoxy laminate sheets (e.g., FR4). The first circuitry layer 52 can be preformed or can be formed using a fine line imaging step is conducted to etch the copper foil 52 as done with many PCB processes. One or more dielectric layers 54, 56 are printed or placed to the surface 58 such that the first circuitry layer 52 is at least partially encased and isolated. In some embodiments, it may be desirable to use a preformed dielectric film to leave air dielectric gaps between traces. Recesses 60 in the dielectric layer 56 to expose circuitry 52 can be formed by printing, embossing, imprinting, chemical etching with a printed mask, or a variety of other techniques.

Figure 2:
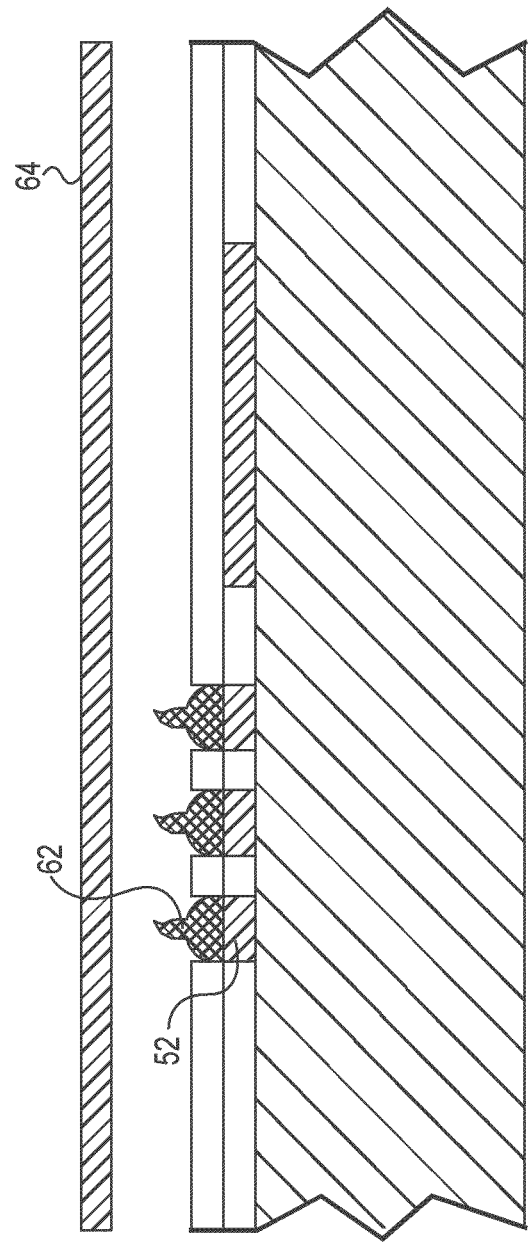
FIG. 2 illustrates via formation on the electrical interconnect of FIG. 1.

As illustrated in FIG. 2, bond points 62, such as for example stud bumps or soldier balls, are added to the exposed circuitry 52 with a traditional bonding machine used in semiconductor packaging applications. Historically, fine gold wire has been used for bonding, with copper seeing increased use in recent years due to the rise in the cost of gold.

Figure 3:
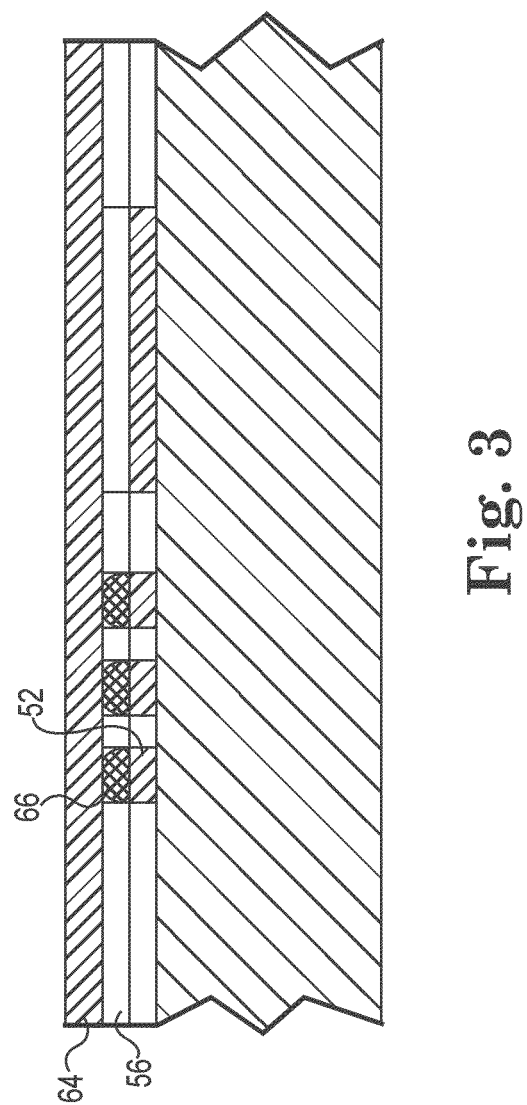
FIG. 3 illustrates application to a second circuitry layer to the electrical interconnect of FIG. 1.

As illustrated in FIG. 3, second circuitry layer 64 is applied to the previous construction such that the bond points 62 are deformed to create the interconnecting vias 66 during the lamination operation. The size and shape of the bond points 62 can be tailored to the ideal condition for deformation without piercing the foil 64.

The second circuitry layer 64 can be pre-etched with the next circuit pattern or can be laminated as a sheet and etched post lamination. In addition, the dielectric material 56 can be left in a tack cure or partial cure state such that a final bond is achieved at final cure. If desired, the bond bumps 62 can be coined planar prior to adding the second circuitry layer 64.

Figure 4:
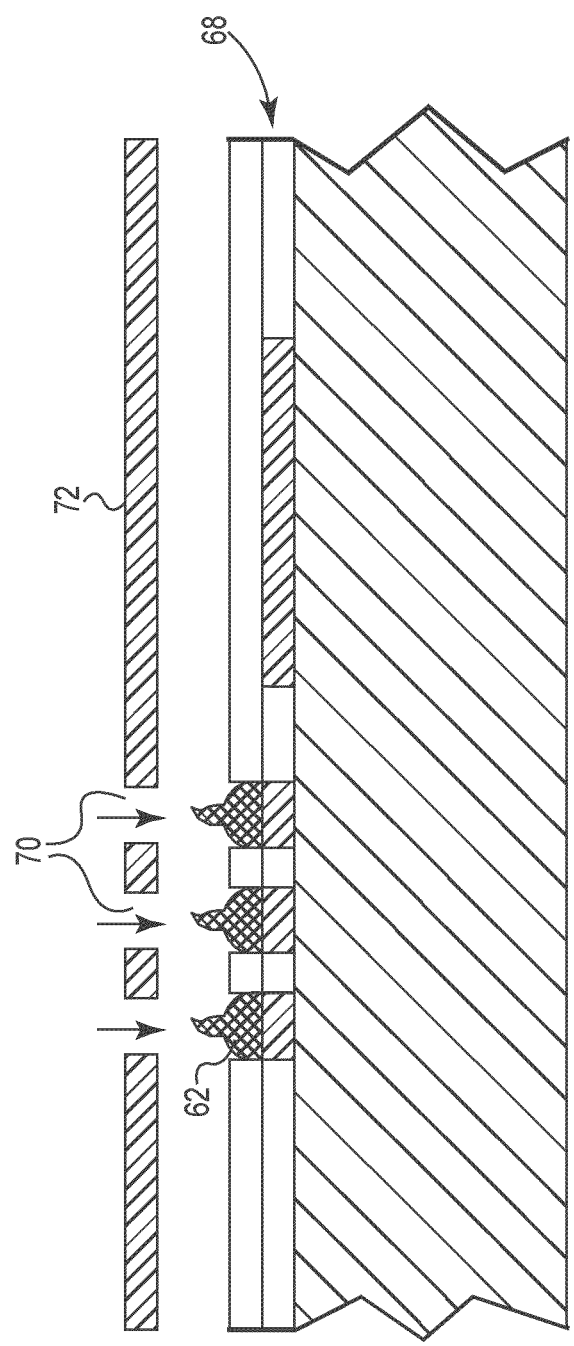
FIG. 4 illustrates an alternate method of making an electrical interconnect for an IC package in accordance with an embodiment of the present disclosure.
Figure 5:
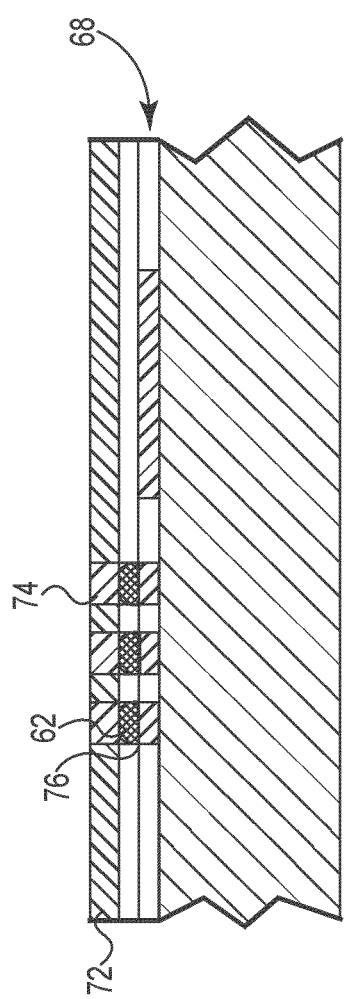
FIG. 5 illustrates application of a second circuitry layer to the electrical interconnect of FIG. 4.

FIGS. 4 and 5 illustrate an alternate interconnect 68 for use in an IC package with preformed holes or breaks 70 in the first circuitry layer 72 in accordance with an embodiment of the present disclosure. The holes 70 permit the bond points 62 to extend into the openings 70 or reside near the openings 70 so plating solution 74 can enter the mating region to plate the via structure 76 together. The plating 74 is preferably a corrosion resistant metallic material such as nickel, gold, silver, palladium, or multiple layers thereof. One benefit of the present structure is the material set can be varied layer by layer or altered on a given layer to create some desired performance enhancement not possible with conventional construction.

Figure 6:
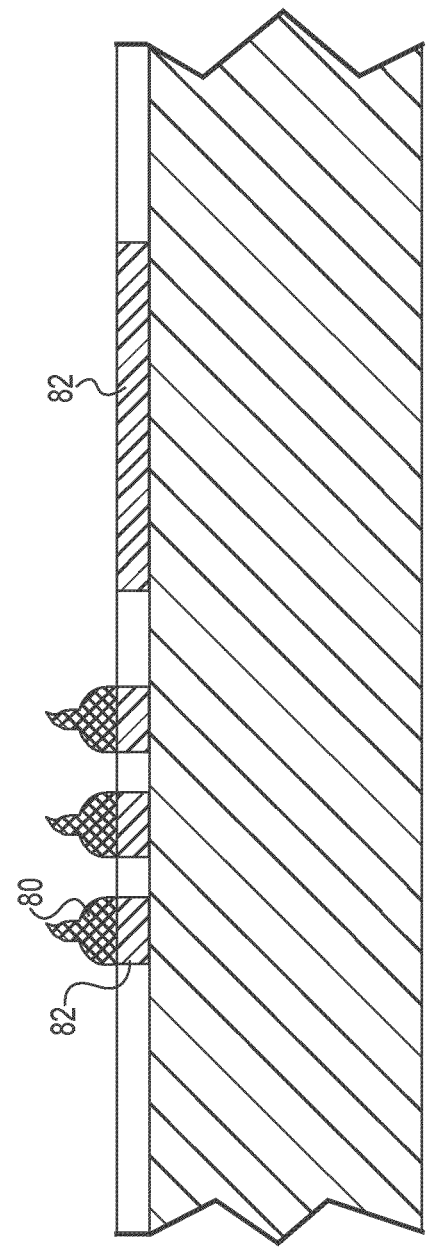
FIG. 6 illustrates another method of making an electrical interconnect for an IC package in accordance with an embodiment of the present disclosure.
Figure 7:
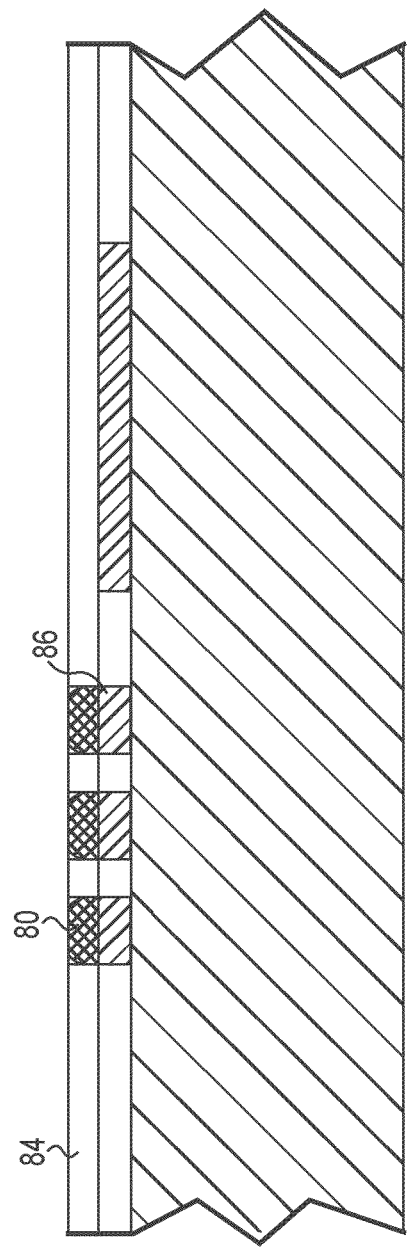
FIG. 7 illustrates via formation on the electrical interconnect of FIG. 6.

FIGS. 6 and 7 illustrate an alternate construction in which bond points 80 are added to the circuitry 82 while it is planar, without upper dielectric layer 84 to provide clearance for the bonding tool to impact the circuitry 82 without encountering or damaging the dielectric 84. The bond points 80 can be coined en masse to planarize them either before or after the dielectric layer 84. In one embodiment, the dielectric layer 84 is added with the bond points 80 in place and then imaged to expose the vias 86 for subsequent application of the next pre-etched circuit layer to be placed and plated together (see e.g., FIGS. 2 and 4). The dielectric layer 84 can optionally be filled or doped with a near endless list of enhancement materials to lower dielectric constant, provide thermal management properties, create rigid, flexible, or compliant regions etc.

Figure 8:
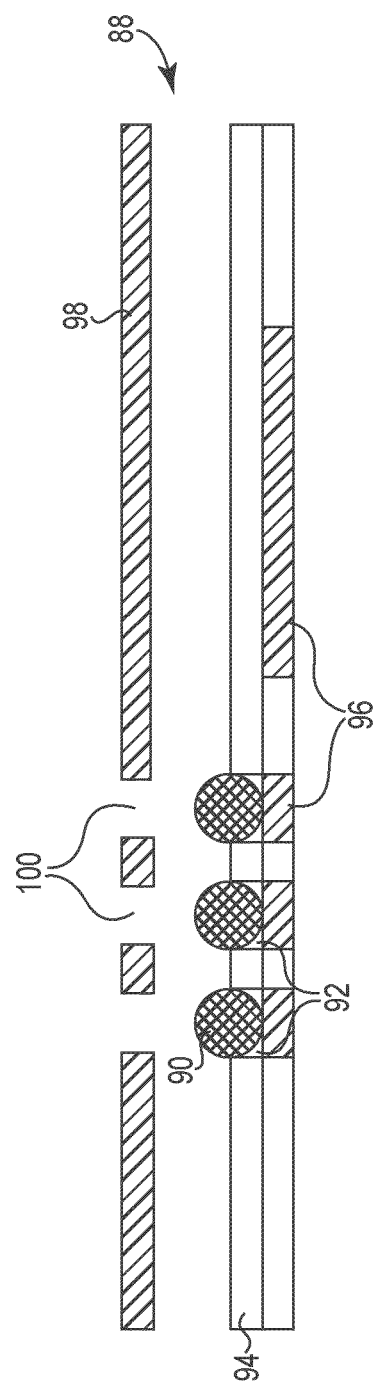
FIG. 8 illustrates an electrical interconnect for an IC package with bulk metal deposited in recesses to form the vias in accordance with an embodiment of the present disclosure.

FIG. 8 illustrates an alternate electrical interconnect 88 with solid bulk metal 90, such as copper or solder spheres, or plated copper, located in recesses 92 in dielectric layer 94 for an IC package in accordance with an embodiment of the present disclosure. The bulk metal 90 electrically couples with the lower circuitry layer 96 and the upper circuitry layer 98 with slight deformation or material displacement. In one embodiment, the bulk metal 90 is plated, such as by flowing a plating solution through openings 100 in the upper circuitry 98. It may be possible to provide sufficient engagement to interconnect reliably without the need for plating since the bulk metal 90 is encased within dielectric 94 and environmentally sealed. In the event the bulk metal 90 is solder, the circuit layers 96, 98 can be interconnected when the solder 90 is reflowed with the dielectric 94 acting as a natural solder wicking barrier.

Figure 9:
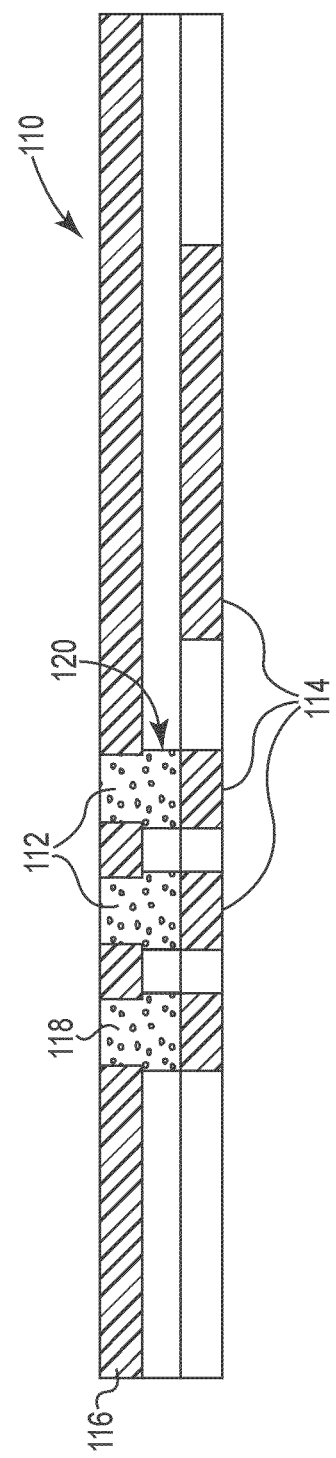
FIG. 9 illustrates an electrical interconnect for an IC package with recesses filed with conductive particles as the vias in accordance with an embodiment of the present disclosure.

FIG. 9 illustrates an alternate electrical interconnect 110 for an IC package with reservoirs 112 between circuitry layers 114, 116 that can be filled with loose conductive particles 118 in accordance with an embodiment of the present disclosure. The conductive particles 118 can optionally be sintered, coined, tightly compacted, plated, mixed with an adhesive binder, etc. to create via 120. The method of FIG. 9 can also be used to create the circuitry itself or supplement the etched foil structures. Use of reservoirs containing conductive particles is disclosed in commonly assigned PCT/US2010/36313 entitled Resilient Conductive Electrical Interconnect, filed May 27, 2010, which is hereby incorporated by reference.

Figure 10:
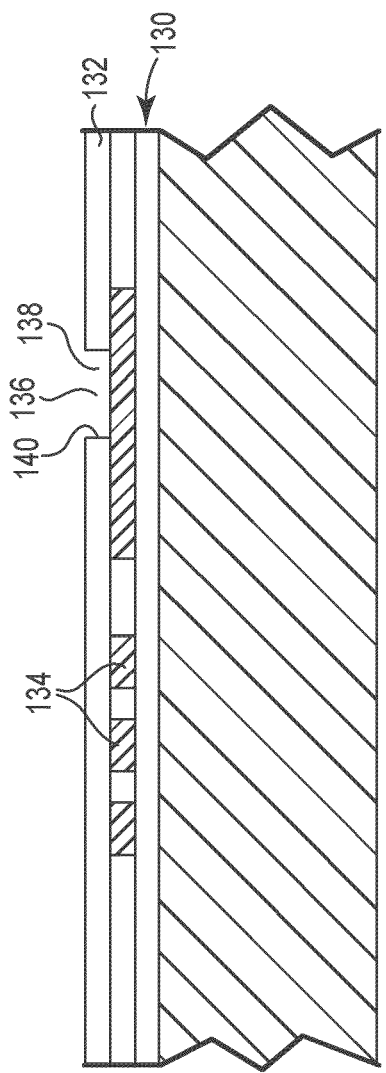
FIG. 10 is a side sectional view of an electrical interconnect for an IC package in accordance with an embodiment of the present disclosure.

FIG. 10 illustrates an alternate electrical interconnect 130 with an insulating layer 132 applied to the circuit geometry 134. The nature of the printing process allows for selective application of dielectric layer 132 to leave selected portions 136 of the circuit geometry 134 expose if desired. The resulting high performance electrical interconnect 130 can potentially be considered entirely "green" with limited or no chemistry used to produce beyond the direct write materials.

The dielectric layers of the present disclosure may be constructed of any of a number of dielectric materials that are currently used to make sockets, semiconductor packaging, and printed circuit boards. Examples may include UV stabilized tetrafunctional epoxy resin systems referred to as Flame Retardant 4 (FR-4); bismaleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyesters, and Ryton® available from Phillips Petroleum Company.

In one embodiment, one or more of the dielectric materials are designed to provide electrostatic dissipation or to reduce cross-talk between the traces of the circuit geometry. An efficient way to prevent electrostatic discharge ("ESD") is to construct one of the layers from materials that are not too conductive but that will slowly conduct static charges away. These materials preferably have resistivity values in the range of $10^5$ to $10^{11}$ Ohm-meters.

Figure 11:
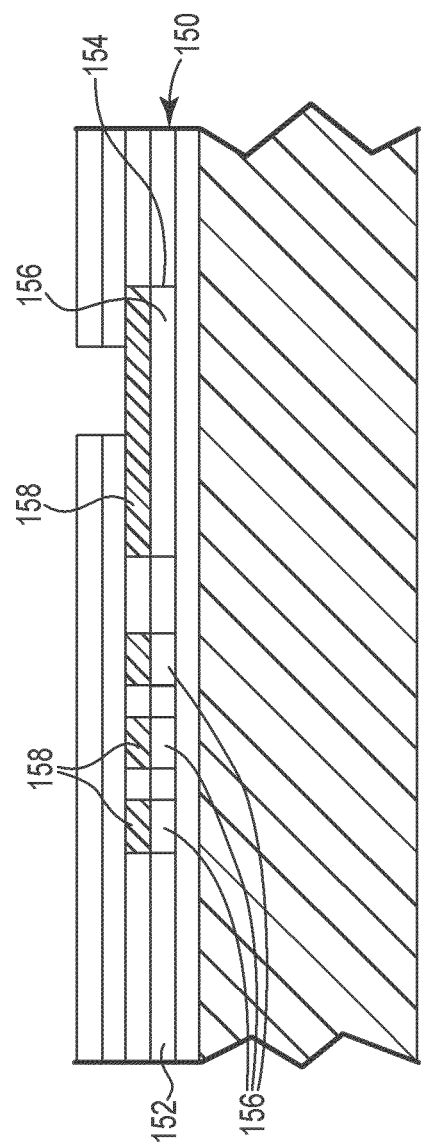
FIG. 11 is a side sectional view of an alternate electrical interconnect for an IC package with printed compliant material in accordance with an embodiment of the present disclosure.

FIG. 11 illustrates an alternate electrical interconnect 150 for an IC package in accordance with an embodiment of the present disclosure. Dielectric layer 152 includes openings 154 into which compliant material 156 is printed before formation of circuit geometry 158. The compliant printed material 156 improves reliability during flexure of the electrical interconnect 150.

Figure 12:
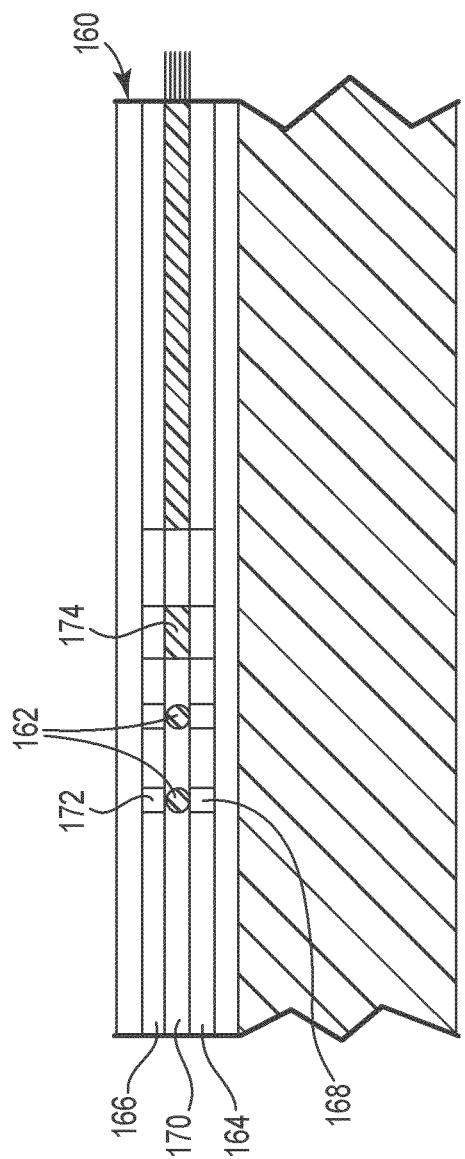
FIG. 12 illustrates an electrical interconnect for an IC package with optical features in accordance with an embodiment of the present disclosure.

FIG. 12 illustrates an alternate electrical interconnect 160 for an IC package in accordance with an embodiment of the present disclosure. Optical fibers 162 are located between layers 164, 166 of dielectric material. In one embodiment, optical fibers 162 is positioned over printed compliant layer 168, and dielectric layer 170 is printed over and around the optical fibers 162. A compliant layer 172 is preferably printed above the optical fiber 162 as well. The compliant layers 168, 172 support the optical fibers 162 during flexure. In another embodiment, the dielectric layer 170 is formed or printed with recesses into which the optical fibers 162 are deposited.

In another embodiment, optical quality materials 174 are printed during printing of the high performance electrical interconnect 160. The optical quality material 174 and/or the optical fibers 162 comprise optical circuit geometries. The printing process allows for deposition of coatings in-situ that enhance the optical transmission or reduce loss. The precision of the printing process reduces misalignment issues when the optical materials 174 are optically coupled with another optical structure.

Figure 13:
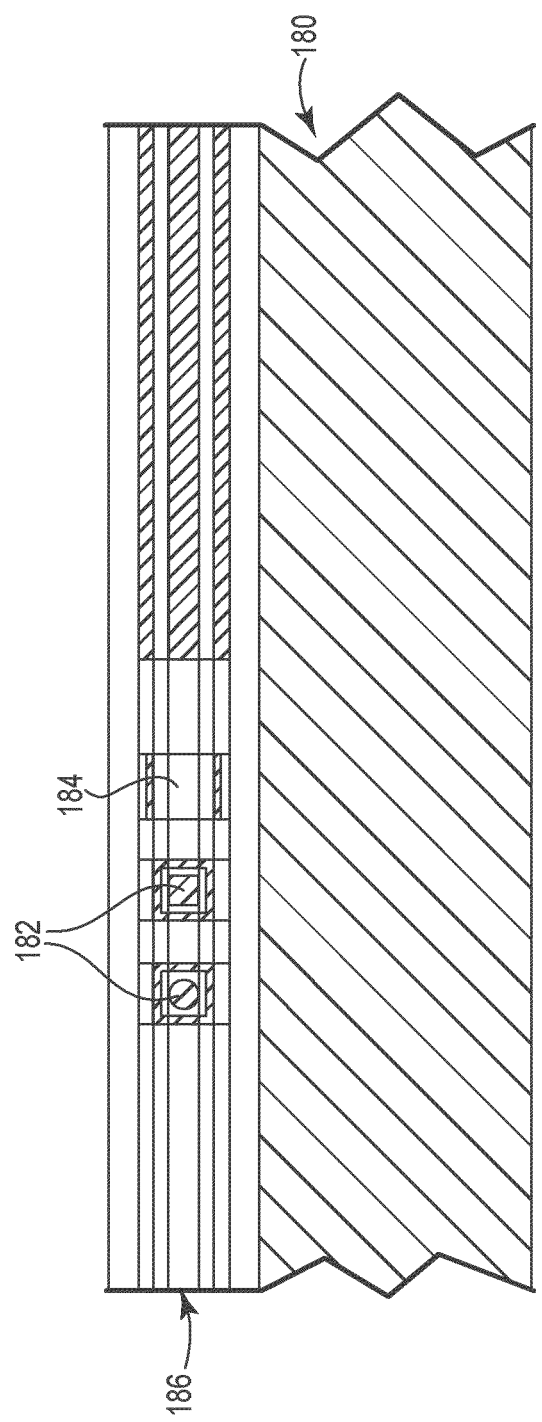
FIG. 13 illustrates an alternate electrical interconnect for an IC package with optical features in accordance with an embodiment of the present disclosure.

FIG. 13 illustrates another embodiment of an electrical interconnect 180 for an IC package in accordance with an embodiment of the present disclosure. Embedded coaxial RF circuits 182 or printed micro strip RF circuits 184 are located with dielectric/metal layers 186. These RF circuits 182, 184 are preferably created by printing dielectrics and metallization geometry.

Figure 14:
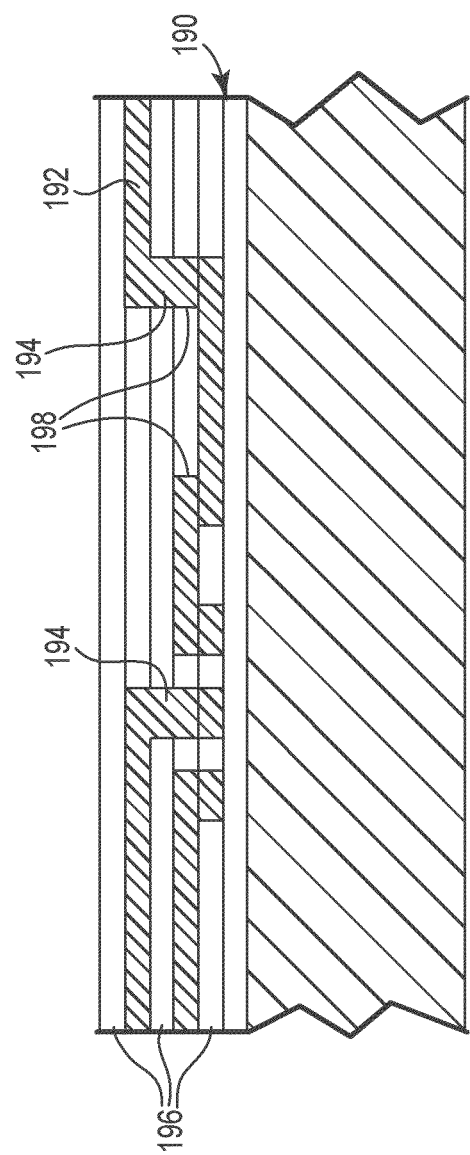
FIG. 14 illustrates an alternate electrical interconnects for an IC package in accordance with an embodiment of the present disclosure.

As illustrated in FIG. 14, use of additive processes allows the creation of a high performance electrical interconnect 190 with inter-circuit, 3D lattice structures 192 having intricate routing schemes. Vias 194 can be printed with each layer, without drilling.

The nature of the printing process permit controlled application of dielectric layers 196 creates recesses 198 that control the location, cross section, material content, and aspect ratio of the conductive traces 192 and the vias 194. Maintaining the conductive traces 192 and vias 194 with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 198 to control the aspect ratio of the conductive traces 192 and the vias 194 results in a more rectangular or square cross-section, with the corresponding improvement in signal integrity.

In another embodiment, pre-patterned or pre-etched thin conductive foil circuit traces are transferred to the recesses 198. For example, a pressure sensitive adhesive can be used to retain the copper foil circuit traces in the recesses 198. The trapezoidal cross-sections of the pre-formed conductive foil traces are then post-plated. The plating material fills the open spaces in the recesses 198 not occupied by the foil circuit geometry, resulting in a substantially rectangular or square cross-sectional shape corresponding to the shape of the recesses 198.

In another embodiment, a thin conductive foil is pressed into the recesses 198, and the edges of the recesses 198 acts to cut or shear the conductive foil. The process locates a portion of the conductive foil in the recesses 198, but leaves the negative pattern of the conductive foil not wanted outside and above the recesses 198 for easy removal. Again, the foil in the recesses 198 is preferably post plated to add material to increase the thickness of the conductive traces 192 in the circuit geometry and to fill any voids left between the conductive foil and the recesses 198.

Figure 15:
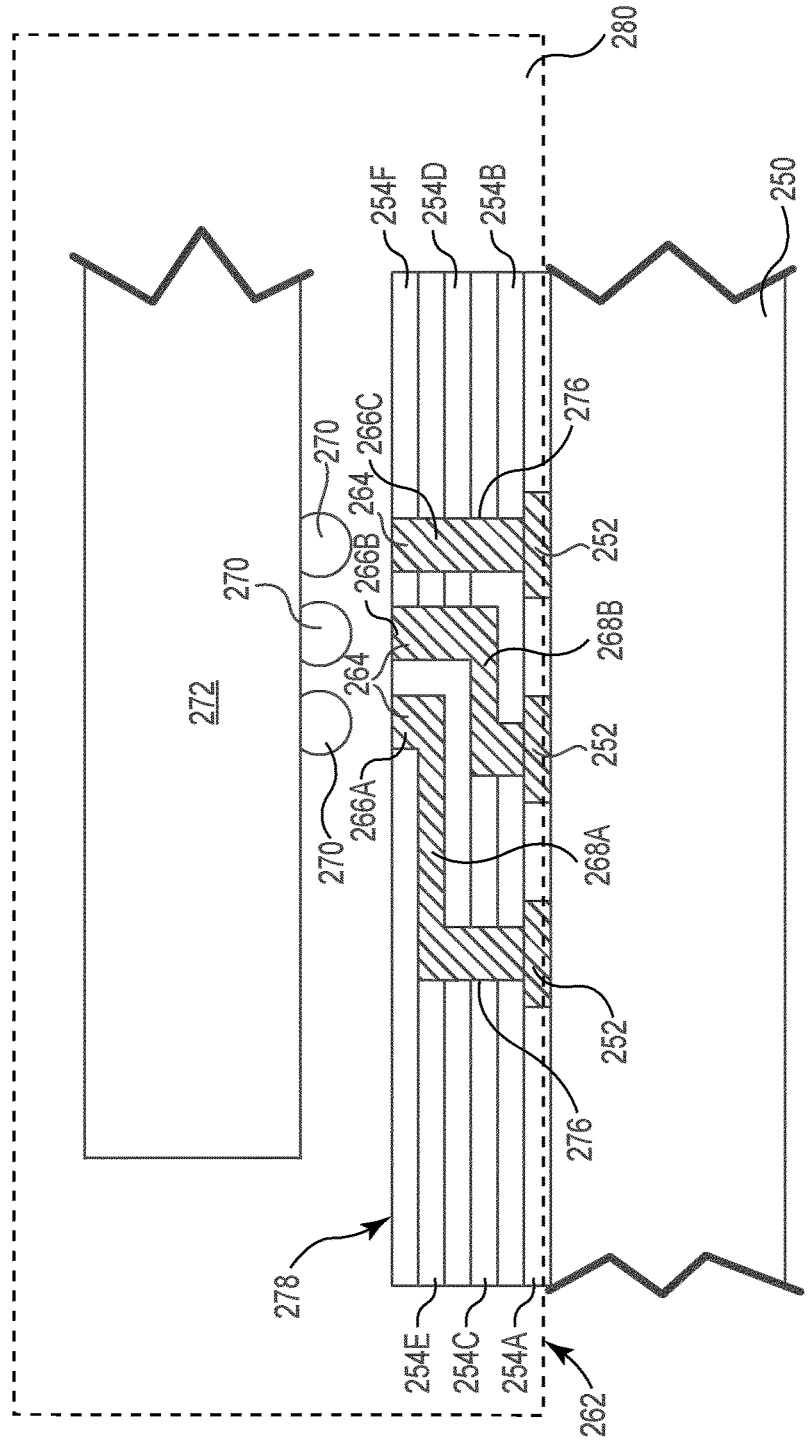
FIG. 15 is a cross-sectional view of an IC package in accordance with an embodiment of the present disclosure.

FIG. 15 is a cross-sectional view of an area array IC package 262, according to one embodiment of the present disclosure. As shown in FIG. 15, additional dielectric layers 254B, 254C, 254D, 254E, 254F (collectively "254") can be printed on the fixture 250 along with conductive material 264 forming contact members 266A, 266B, 266C (collectively "266") to complete interconnect assembly 278. In one embodiment, the dielectric layers 254 are printed to create cavities 276 or recesses at the desired locations for depositing conductive material 264. The conductive material 264 may be, for example, a metallic powder that can be sintered to create contact members 266 or a flowable, curable conductive material.

The conductive material 264 is preferably deposited in a first state and then processed to create a second more permanent state. For example, metallic powder can be deposited in the cavities 276 and subsequently sintered, or curable conductive material can flow into the cavities 276 and subsequently cured. As used herein "cure" and inflections thereof refers to a chemical-physical transformation that allows a material to progress from a first form (e.g., flowable form) to a more permanent second form. The term "curable" refers to a characteristic of a material having the potential to be cured, such as for example by the application of a suitable energy source.

In the illustrated embodiment, conductive traces 268A, 268B route the contact members 266A and 266B to correspond to the terminals 270 on the IC device 272. The terminal pads 252 are arranged in an array that corresponds to contact pads 258 on a circuit member 260 to which the IC package 262 will be attached (see e.g., FIG. 16). Various methods for deposition of electronic materials may also be used to deposit the conductive material 264 in the cavities 276 or to print the dielectric layers 254, such as for example, screen printing, printing through a stencil, flexo-gravure printing, offset printing, inkjet printing, and aerosol printing as previously explained.

The cavities 276 in the layers 254 permit control of the location, cross section, material content, and aspect ratio of the contact members 266 and the conductive traces 268. Maintaining the conductive traces 268 with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the cavities 276 to control the aspect ratio of the conductive traces 268 can result in a more rectangular or square cross-section of the conductive traces, and a corresponding improvement in signal integrity.

In another embodiment, pre-patterned or pre-etched thin conductive foil circuit traces are transferred to recesses or trenches in the layers 254. For example, a pressure sensitive adhesive can be used to retain the copper foil circuit traces in the recesses. The trapezoidal cross-sections of the pre-formed conductive foil traces are then post-plated. The plating material fills the open spaces in the recesses not occupied by the foil circuit geometry, resulting in a substantially rectangular or square cross-sectional shape corresponding to the shape of the recesses.

In another embodiment, a thin conductive foil is pressed into the recesses, and the edges of the recesses acts to cut or shear the conductive foil. The process positions a portion of the conductive foil in the recesses, but leaves the negative pattern of the conductive foil not wanted outside and above the recesses for easy removal. Again, the foil in the recesses are preferably post plated to add material to increase the thickness of the conductive traces and to fill any voids left between the conductive foil and the recesses.

In one embodiment, some or all of the dielectric layers 254 are a compliant material that provides the contact members 266 with a degree of compliance. In one embodiment, solder balls 270 are coupled to the IC device, but are not reflowed, and an electrical connection is formed by compressive forces. The compliant layers 254 bias the contact members 266 into engagement with the solder balls 270.

The interconnect assembly 278 and the IC device 272 are then enclosed in packaging 280. The packaging 280 can be a preformed structure, such as for example a plastic or ceramic substrate, an encapsulating material, or a combination thereof. In one embodiment, the packaging 280 is a curable material printed using the printing technology discussed herein. In another embodiment, the interconnect assembly 278 and IC device 272 are encapsulated in an epoxy material. The packaging 280 can be completed before or after the interconnect assembly 278 is removed from the fixture 250.

Figure 16:
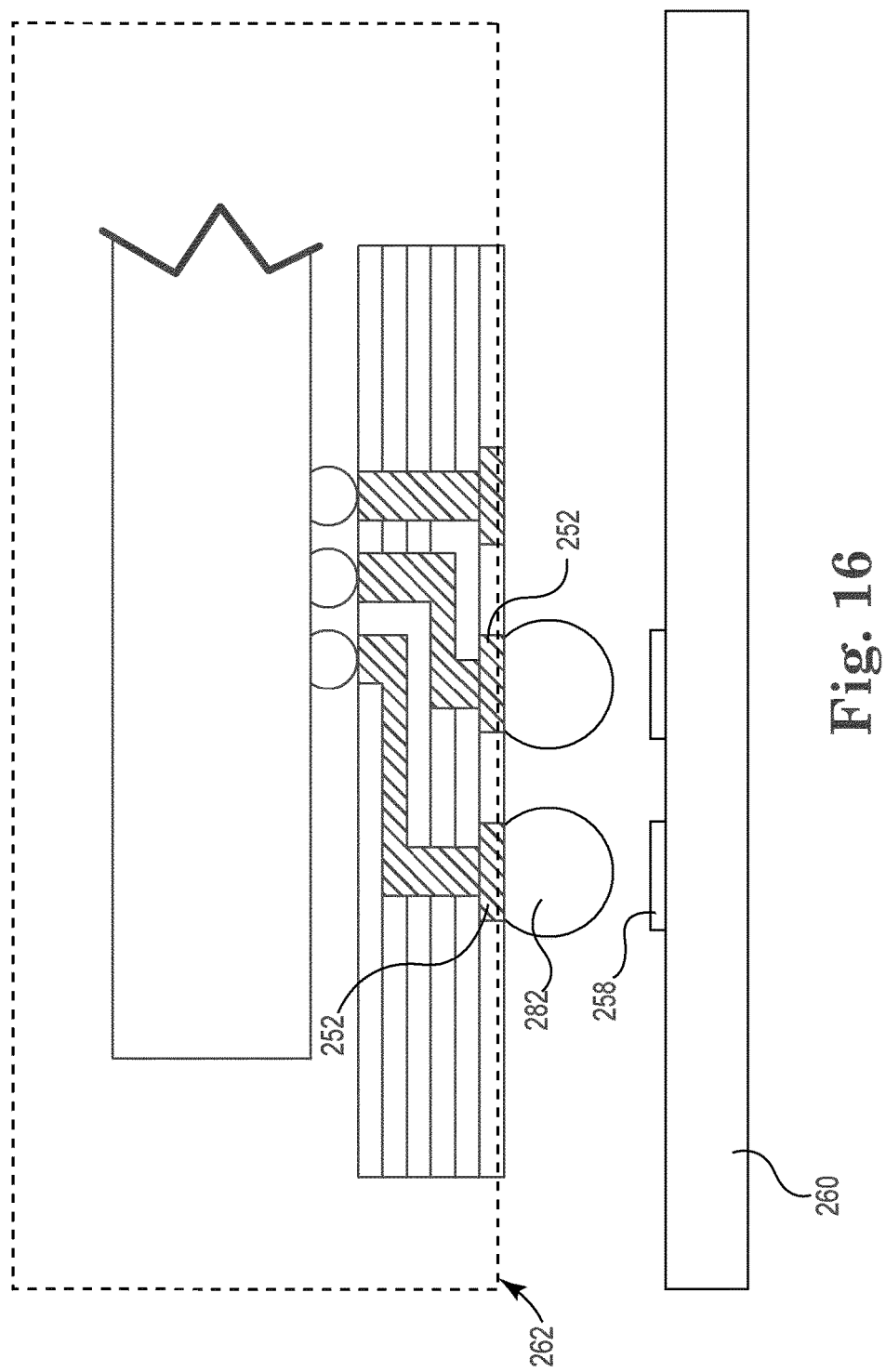
FIG. 16 is a cross-sectional view of an IC package with a ball grid array (BGA) interface in accordance with an embodiment of the present disclosure.

FIG. 16 is a cross-sectional view of an area array IC package with a BGA interface in accordance with an embodiment of the present disclosure. FIG. 16 illustrates the IC package 262 removed from the fixture 250 (shown in FIG. 15). In the illustrated embodiment, solder balls 282 are attached to terminal pads 252. The solder 282 is preferably reflowed to electrically couple with contact pads 258 on a circuit member 260. The circuit member 260 can be another packaged integrated circuit device, an unpackaged integrated circuit device, a printed circuit board, a flexible circuit, a bare-die device, an organic or inorganic substrate, a rigid circuit, or any other device capable of carrying electrical current. In another embodiment, the solder balls 282 are omitted and the IC package 262 is used in an LGA configuration.

Figure 17:
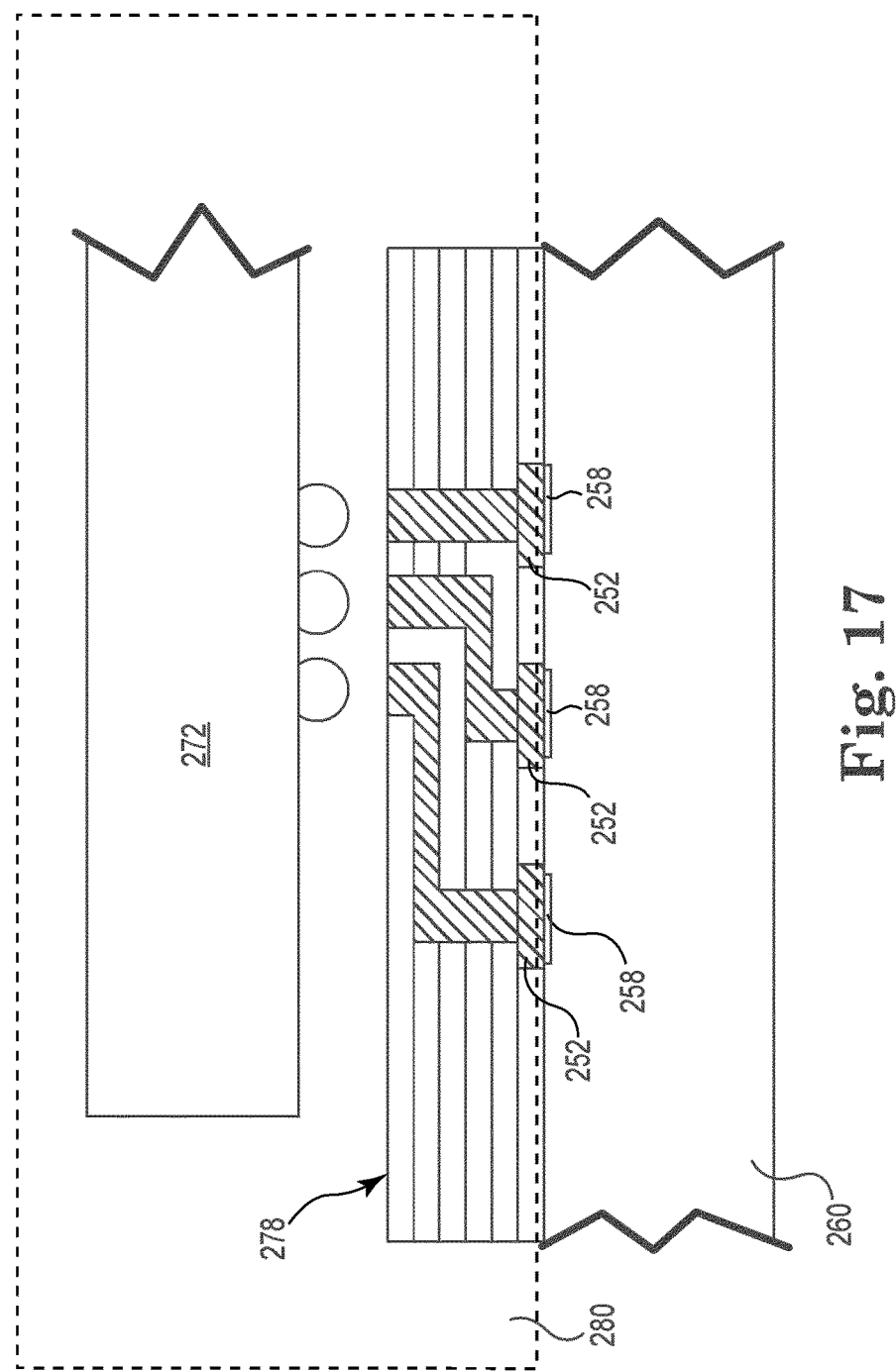
FIG. 17 is a cross-sectional view of an IC package printed directly on another circuit member in accordance with an embodiment of the present disclosure.

FIG. 17 is a cross-sectional view of an IC package printed directly on another circuit member in accordance with an embodiment of the present disclosure. As shown in FIG. 17, a circuit member 260 can be substituted for fixture 250 during the process of forming the IC package. The interconnect assembly 278 can be formed directly on the circuit member 260, such as for example a PCB. The terminal pads 252 can be formed directly on the contact pads 258. The packaging 280 can be applied directly to the interconnect assembly 278 and IC device 272, sealing and attaching the interconnect assembly 278 directly to the printed circuit board 260. In one embodiment, the functionality of the IC device 272 may be tested before the packaging 280 is applied.

Figure 18:
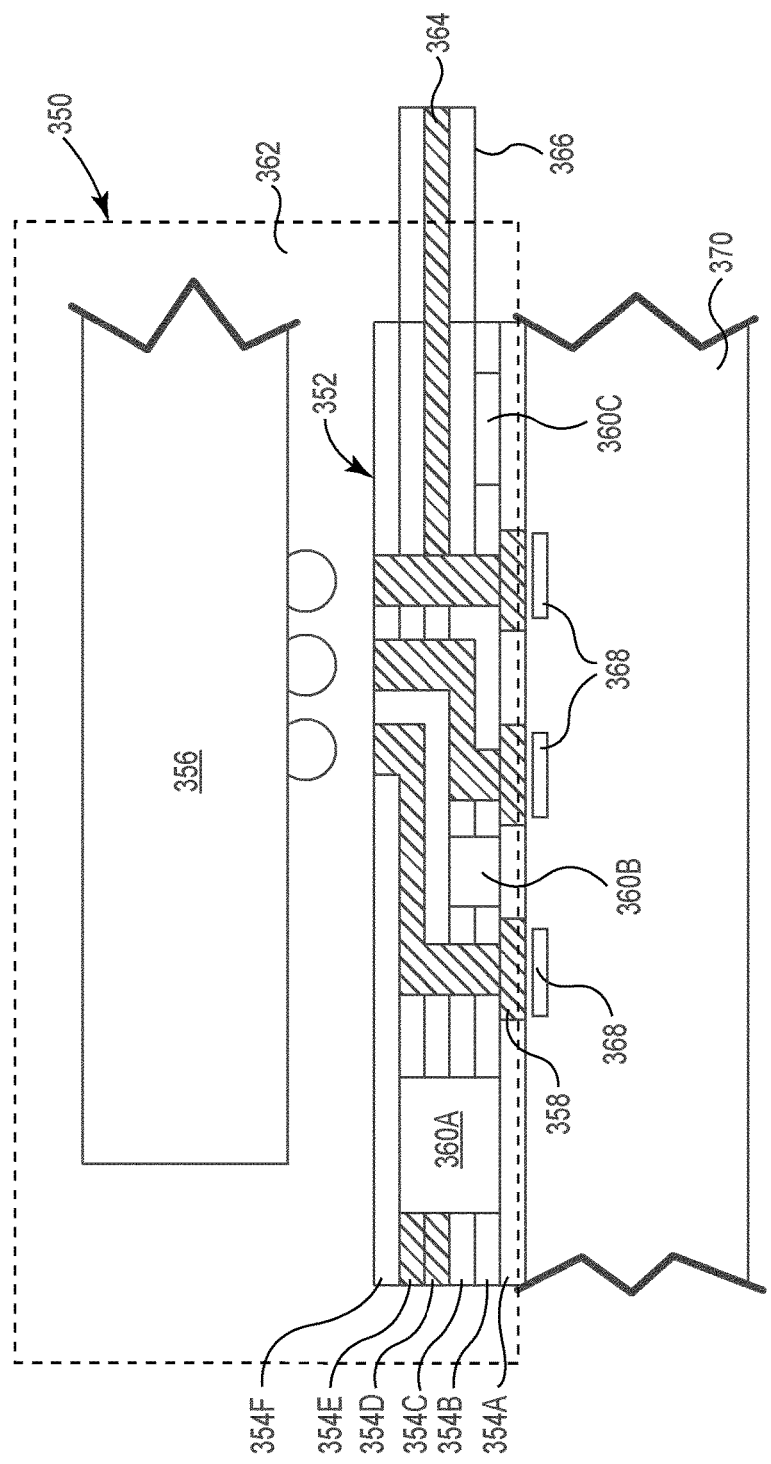
FIG. 18 is a cross-sectional view of an alternate fixture for making an IC package in accordance with an embodiment of the present disclosure.

FIG. 18 is a cross-sectional view of an alternate IC package 350 with additional functionality built into the interconnect assembly 352 in accordance with an embodiment of the present disclosure. One or more of the layers 354A, 354B, 354C, 354D, 354E, 354F (collectively "354") can include additional functionality, such as for example, specialty dielectrics, ground planes, power planes, shielding layers, stiffening layers, capacitive coupling features, circuitry layers, and the like. The close proximity of the layers 354 to the IC device 356 can improve electrical performance.

The additional functionality can also be provided by additional electrical devices 360A, 360B, and 360C (collectively "360"). The additional electrical devices 360 can be shielding, near device decoupling, capacitors, transistors, resistors, filters, signal or power altering and enhancing devices, memory devices, embedded IC, RF antennae, and the like. The electrical devices 360 can include passive or active functional elements. Passive functional elements may refer to structures having a desired electrical magnetic, or other property, including but not limited to a conductor, resistor, capacitor, inductor, insulator, dielectric, suppressor, filter, varistor, ferromagnet, and the like.

The electrical devices 360 can be added as discrete components or printed onto one of the layers 354. In a preferred embodiment, the electrical devices 360 can be printed onto the interconnect assembly 352. As described herein, the availability of printable inks containing silicon and/or carbon nanotubes provides the ability to print electrical devices 360. Electrical devices that are typically located on a separate IC device or the circuit member 370 can be incorporated into the IC package 350, thereby improving electrical performance.

In the illustrated embodiment, the interconnect assembly 352 extends beyond the packaging 362. Conductive traces 364 permit and extension 366 to connect to other electrical devices, such as for example an external power source, another IC device, a test station, and the like. In the illustrated embodiment, terminal pads 358 form an LGA configuration with contact pads 368 on circuit member 370.

Figure 19:
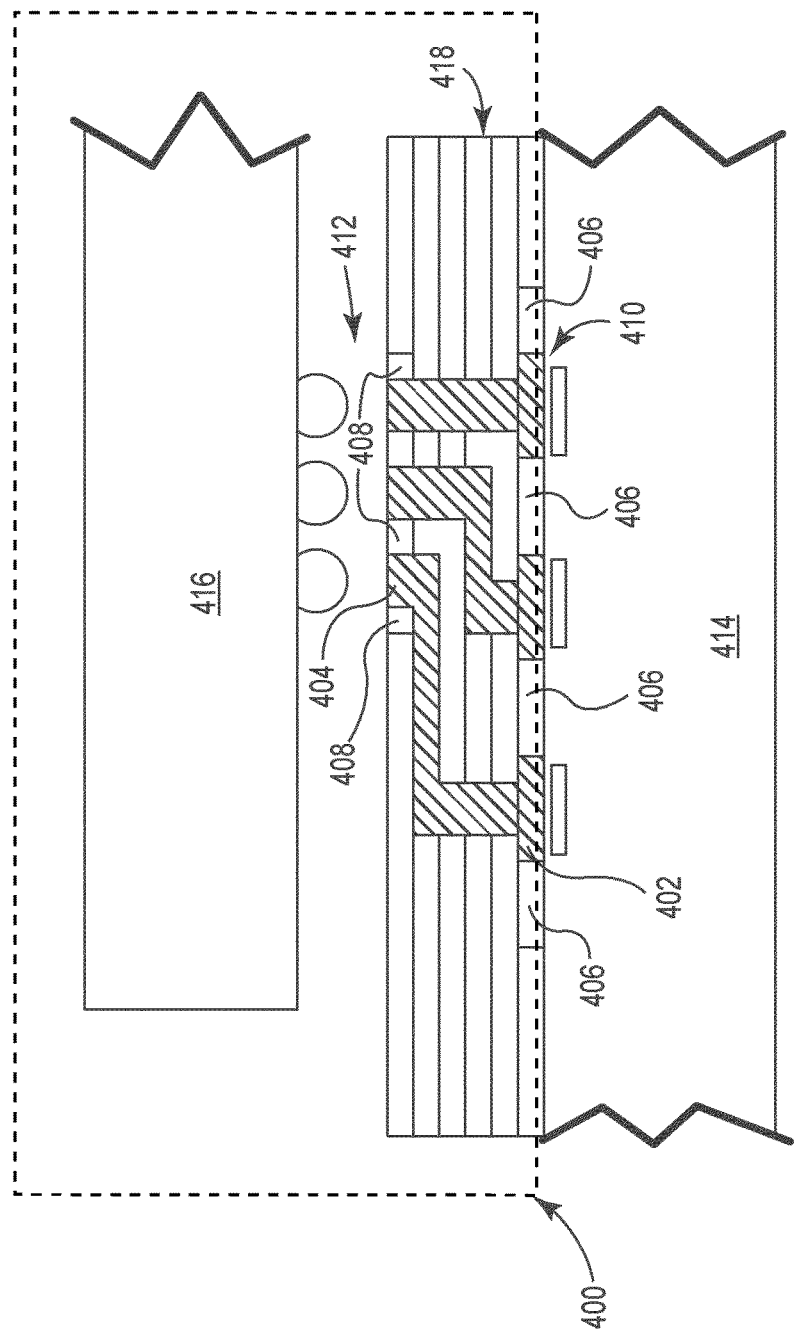
FIG. 19 is a cross-sectional view of an IC package in accordance with an embodiment of the present disclosure.
Figure 20:
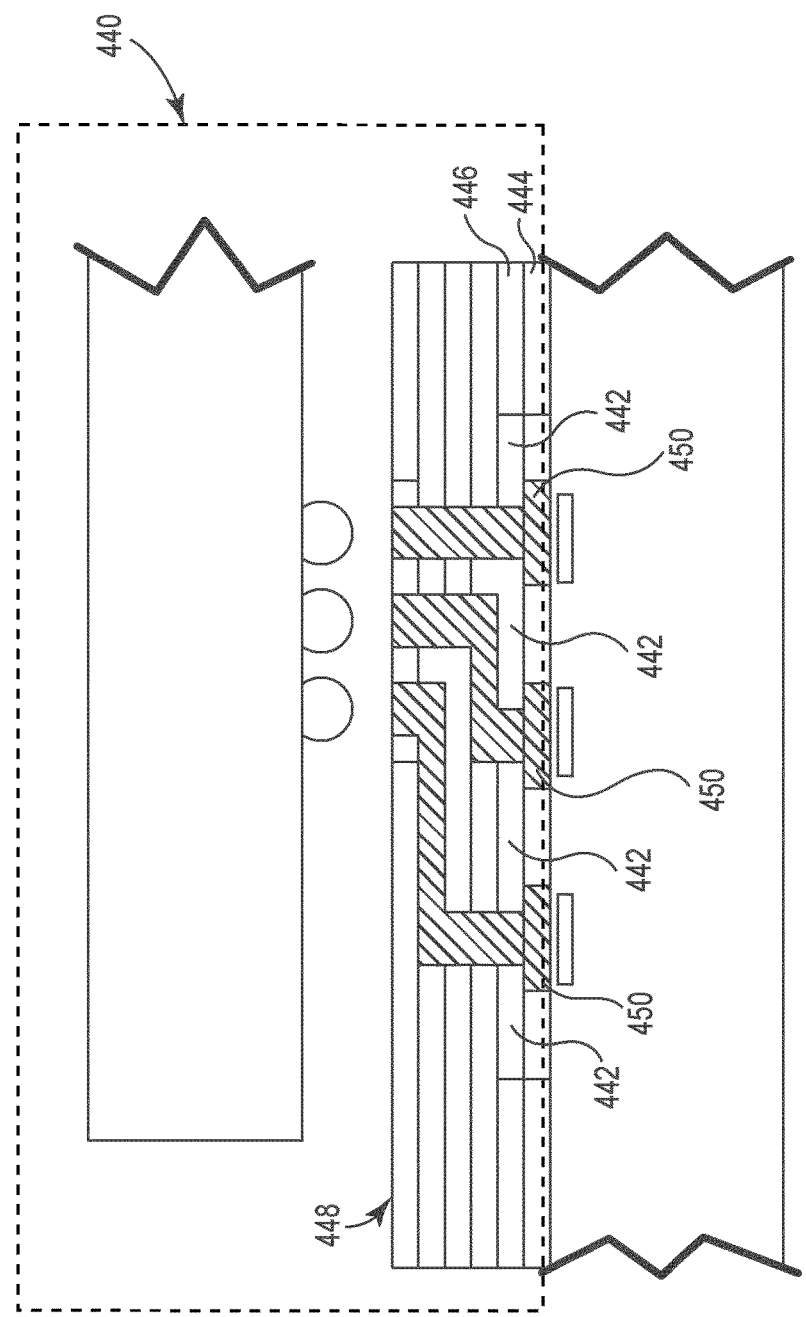
FIG. 20 is a cross-sectional view of a solderless area array IC package in accordance with an embodiment of the present disclosure.

FIG. 19 is an alternate IC package 400 with additional compliance built into the interconnect assembly 418 in accordance with an embodiment of the present disclosure. Compliant material 406 can be printed around terminal pads 402 and compliant material 408 can be printed around terminal pads 404. The additional compliance can assist with decoupling stress at interface 410 with a PCB 414 and the interface 412 with an IC device 416. FIG. 20 is an IC package 440 configured as a variation of the IC package 400 of FIG. 19. In the IC package 440 compliant material 442 extends into the first two layers 444, 446 of the interconnect assembly 448, providing a higher degree of compliance around terminal pads 450.

FIG. 21 is an alternate IC package 460 with terminal pads 462A, 462B, 462C (collectively "462") that create a standoff with a circuit member 464 in accordance with an embodiment of the present disclosure. The terminal pads 462 can extend beyond the packaging 466 and maintain a gap 468 between the packaging 466 and the circuit member 464. The various dielectric layers 470 provide a degree of compliance, especially for the terminal pads 462A and 462B, which are coupled to the conductive traces 472 to create an offset relative to the terminal pads 474A, 474B. In one embodiment, the IC package 460 is electrically coupled with contact pads 476 on circuit member 464 without solder.

FIG. 22 is an alternate IC package 500 with terminal pads 502A, 502B, 502C (collectively "502"), which also create a standoff with a circuit member 504 in accordance with an embodiment of the present disclosure. Compliant material 506 can be printed to the interconnect assembly 508 around orthogonally oriented conductive traces 510 to promote compliance of the terminal pads 502. The compliant material 506 near the terminals 502 can provide stress decoupling. The geometry of the terminals 502 can provide a more reliable connection than a solder ball when plugged into a solderless socket. In one embodiment, the IC package 500 can be electrically coupled with contact pads 512 on the circuit member 504 without solder.

FIGS. 23A and 23B are side sectional views of an IC package 520 that enables a variety of packaged to be stacked in what is called a package-to-package structure in accordance with an embodiment of the present disclosure. The IC device 532 is located in recess 554 formed by lower substrate 534, interconnect 530 and upper substrate 536. In the illustrated embodiment, the interconnect 530 surrounds the IC device 532.

In the illustrated embodiment, lower surface 522 of substrate 524 is a BGA package solder balls 528 are electrically coupled to solder pads 526 on the substrate 524. The IC package 520 is surface mount technology BGA style interconnect 530 configured around IC device 532. The interconnect 530 is soldered to the top side of the lower package substrate 534.

The upper BGA package 536 is plugged into the interconnect 530 by mechanically coupling with beams 540 of contact members 542 that are positioned in recess 544 in layer 546. In the illustrated embodiment, the contact members 542 are positioned in slots 548 in layer 550. Slot 548 is preferably imaged and developed, and then filled with dielectric 552. The beams 540 are configured to flex outward within recess 544 in response to compressive engagement with solder ball 554 on BGA package 536.

FIG. 23B is a side sectional view of an IC package 560 that enables a variety of packaged to be stacked in what is called a package-to-package format in accordance with an embodiment of the present disclosure. Proximal ends 562 of the contacts 542 are embedded into the lower package 534 without the need for the solder ball 526.

FIGS. 24A and 24B are side sectional views of an alternate IC package 570 with a multi-layer, multi-point format that enables a package-to-package system in accordance with an embodiment of the present disclosure. The electrical interconnect 572 portion of the package 570 includes a plurality of contact structure 574A, 574B, 574C ("574"). The contact structures 574 are configured to engage with only a portion of the solder ball 576 near the BGA device 578. Polymer film 580 is modified to include a tab 582 that provides biasing force 584 to retain the solder ball 576 in recess 586.

In the illustrated embodiment, the contact structures 574B and 574C are embedded in the vias 588. The contact structure 574 is sized to engage the theoretical diameter "D" of the solder balls 576, and the contact structure 574C with the base "B" of the solder ball 576 with a slight interference. In the illustrated embodiment, each contact structure 576 includes five contact points 590 resulting in a total of fifteen contact points 590 engaged with the solder balls 576. In an alternate embodiment, the interconnect 572 is a multilayered structure and the contact structures 576, 576C are sandwiched between the layers as well as embedded in the via 588.

In the illustrated embodiment, the interconnect 572 is mechanically and electrically coupled to the circuit member 592 by solder balls 594. FIG. 24B illustrate a variation of the IC package 570 in which the interconnect 572 forms an LGA interface to the circuit member 592.

FIGS. 25A and 25B are side sectional views of an alternate IC package 600 mated to a flexible circuit 602 in accordance with an embodiment of the present disclosure. Upper substrate 604 and lower substrate 606 of the package 600 cooperate to surround and protect integrated circuit device 608 in recess 609. The IC device 608 is electrically coupled to conductive traces on the lower substrate 606. Those conductive traces are electrically coupled to posts 610. The posts or protrusions 610 mechanically and electrically couple with beams 612 of contact members 614 on upper substrate 604, as discussed in connection with FIG. 23A.

In the embodiment of FIG. 25A, the flexible circuit 602 is mechanically and electrically coupled to the package 600 by solder balls 616. FIG. 25B illustrate a variation of the IC package 600 in which the flexible circuit 602 forms an LGA interface to the contact member 614. Proximal portion 618 of the contact member 614 is preferably embedded into the flexible circuit 602 without the need for the solder ball 616.

Figures 26A, 26B:
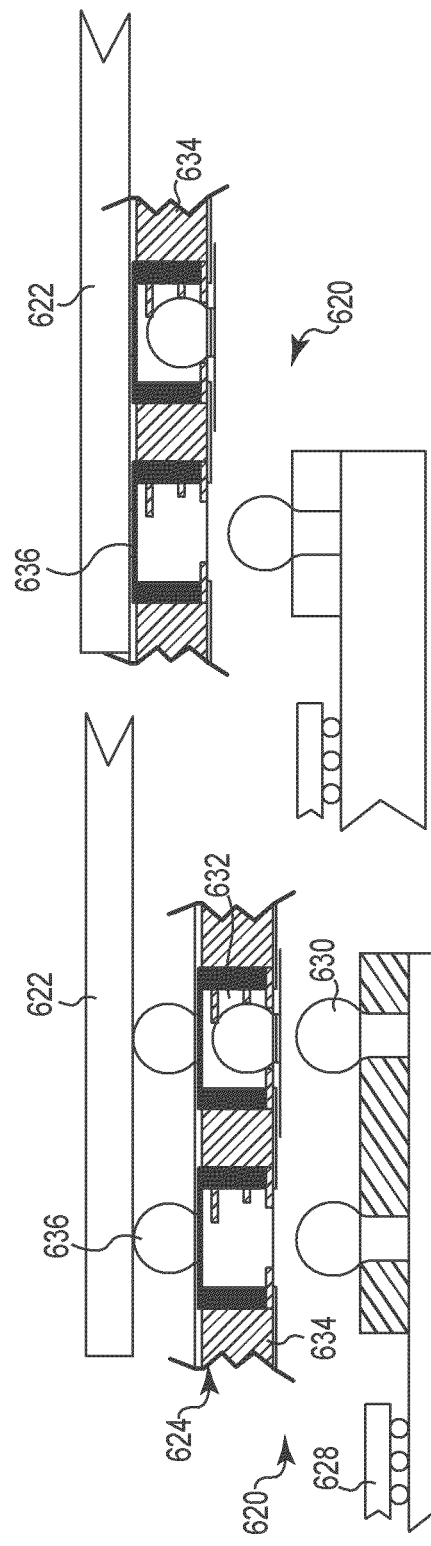
FIGS. 26A and 26B are side sectional views of a package-to-package structure with a multiple layer electrical interconnect coupled to a flexible circuit in accordance with an embodiment of the present disclosure.

FIGS. 26A and 26B are side sectional views of an alternate IC package 620 mated to a flexible circuit 622 in accordance with an embodiment of the present disclosure. Upper portion 624 and lower portion 626 of the package 620 cooperate to surround and protect integrated circuit device 628. The lower portion 626 includes posts with protrusions 630 that mechanically and electrically couple with recess 632 of interconnect 634 on upper portion 624, as discussed in connection with FIG. 24A.

In the embodiment of FIG. 26A, the flexible circuit 622 is mechanically and electrically coupled to the package 620 by solder balls 636. FIG. 26B illustrate a variation of the IC package 620 in which metalized pads 636 on the interconnect 634 forms an LGA interface with the flexible circuit 622.

Figure 27:
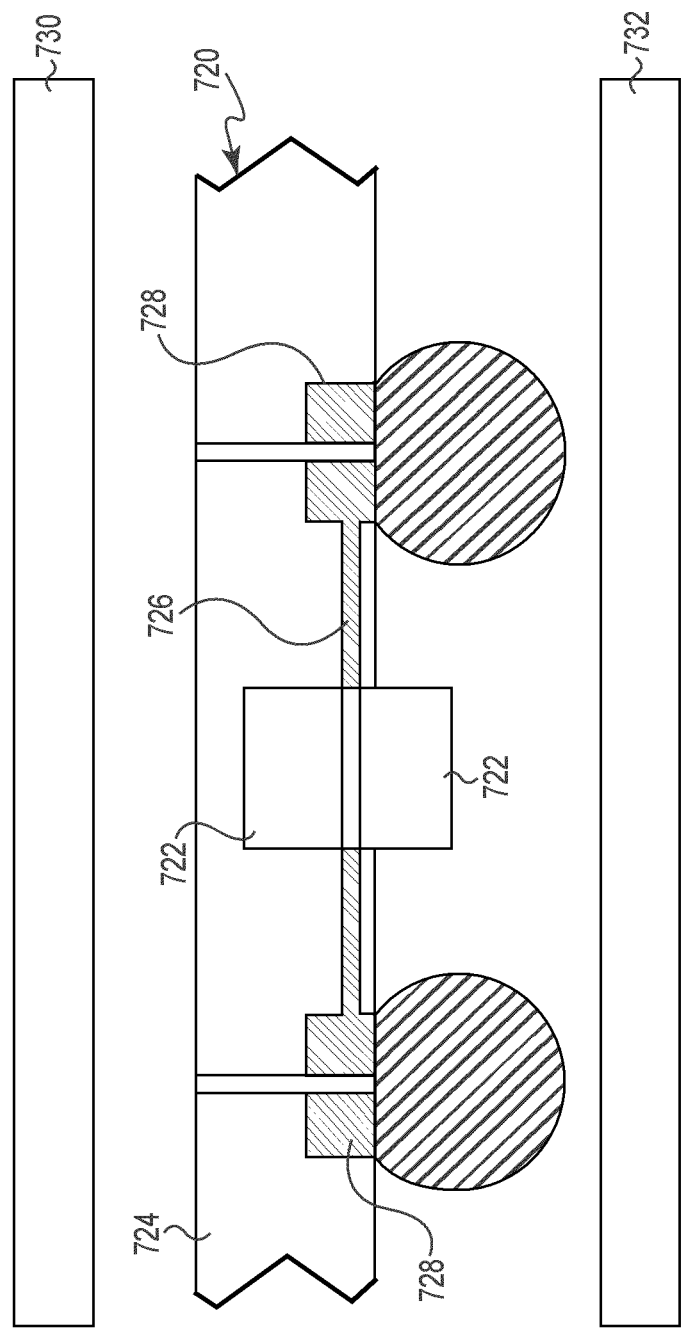
FIG. 27 illustrates an electrical interconnect for an IC package with on-board electrical devices in accordance with an embodiment of the present disclosure.

FIG. 27 illustrates electrical interconnect 720 for an IC package with on-board electrical devices 722, such as for example, internal decoupling capacitors, located on substrate 724 in accordance with an embodiment of the present disclosure. Printed conductive traces 726 electrically couple the electrical devices 722 to one or more of the contact pads 728. The electrical devices 722 can be added as discrete components or printed materials, reducing the need for discrete components on the PCB 732 and the integrated circuit device 730. Locating the electrical devices 722 in the semiconductor socket 720 permits integrated circuit manufactures to reduce or eliminate the capacitors currently located on the package 730 and printed circuit board 732. This shift can greatly reduce cost and simplify the package 730 and printed circuit board 732, while improving performance.

The electrical devices 722 can be a power plane, ground plane, capacitor, resistor, filters, signal or power altering and enhancing device, memory device, embedded IC, RF antennae, and the like. The electrical devices 722 can be located on either surface of the substrate 724, or embedded therein. The electrical devices 722 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like.

Locating such electrical devices 722 on the electrical interconnect 720 improves performance and enables a reduction in the cost of integrated circuit devices and the PCB 732. Integrated circuit manufactures are limited by the pitch that the PCB 732 can accommodate and still keep the printed circuit board to four layers. The integrated circuit makers can manufacture the integrated circuit device 730 with a smaller pitch, but with the pin counts is so high that the printed circuit board 732 likely requires additional layers in order to route all of the signals. The present electrical interconnect 720 also permits integrated circuit manufactures to reduce the pitch of the contacts on the IC device 730, and perform any required signal routing in the electrical interconnect 720, rather than in the printed circuit board 732 or by adding daughter boards to the system.

Figure 28:
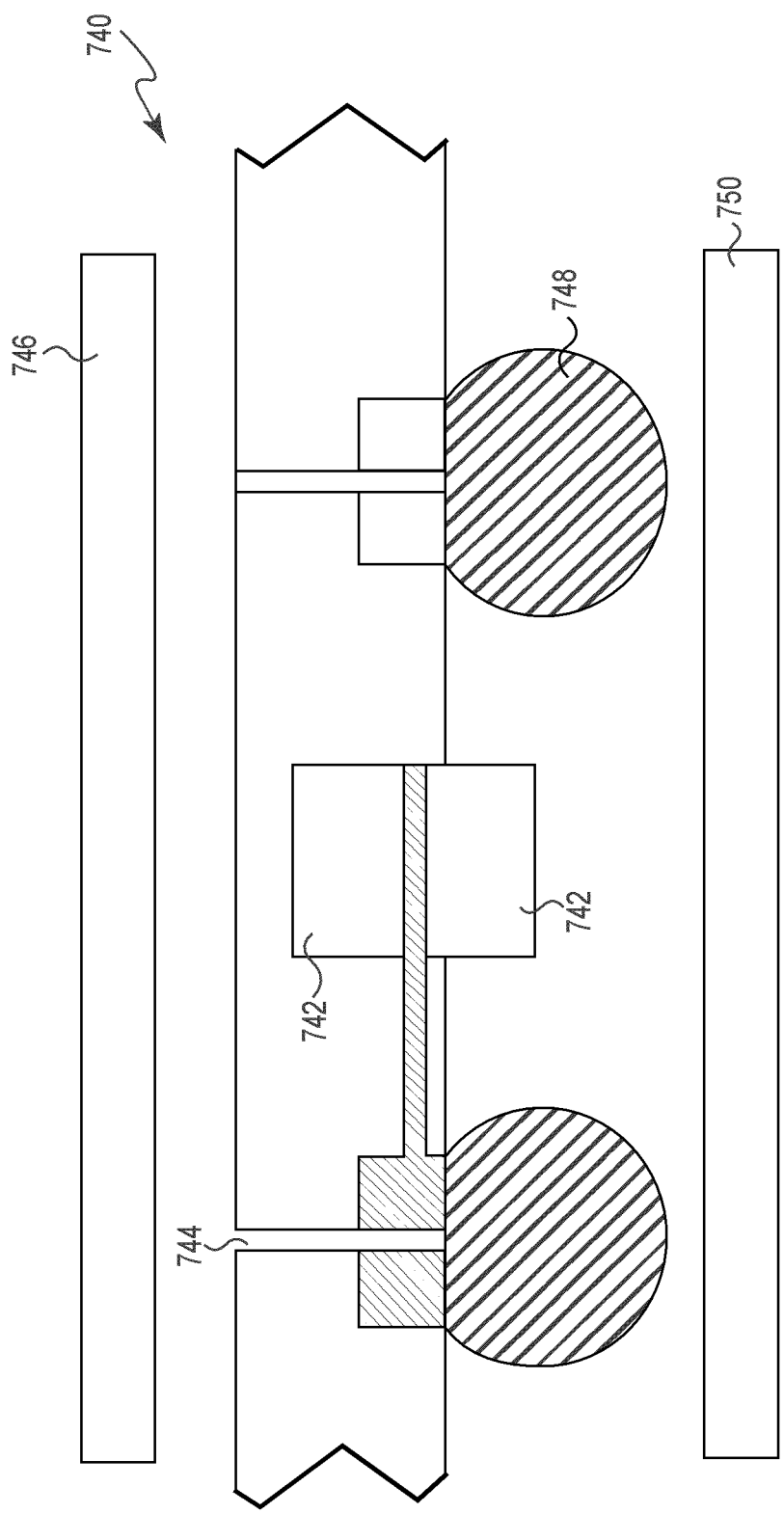
FIG. 28 illustrates an alternate electrical interconnect for an IC package with on-board electrical devices in accordance with an embodiment of the present disclosure.

FIG. 28 illustrates an alternate electrical interconnect 740 for an IC package with on-board electrical devices 742 in accordance with an embodiment of the present disclosure. The decoupling capacitance 742 can be a discrete embedded or printed electrical device. Contact member 744 provides the electrical connection to the capacitor located on the semiconductor device 746 and solder ball 748 provides the electrical connection to the capacitor located on printed circuit board 750.

Figure 29:
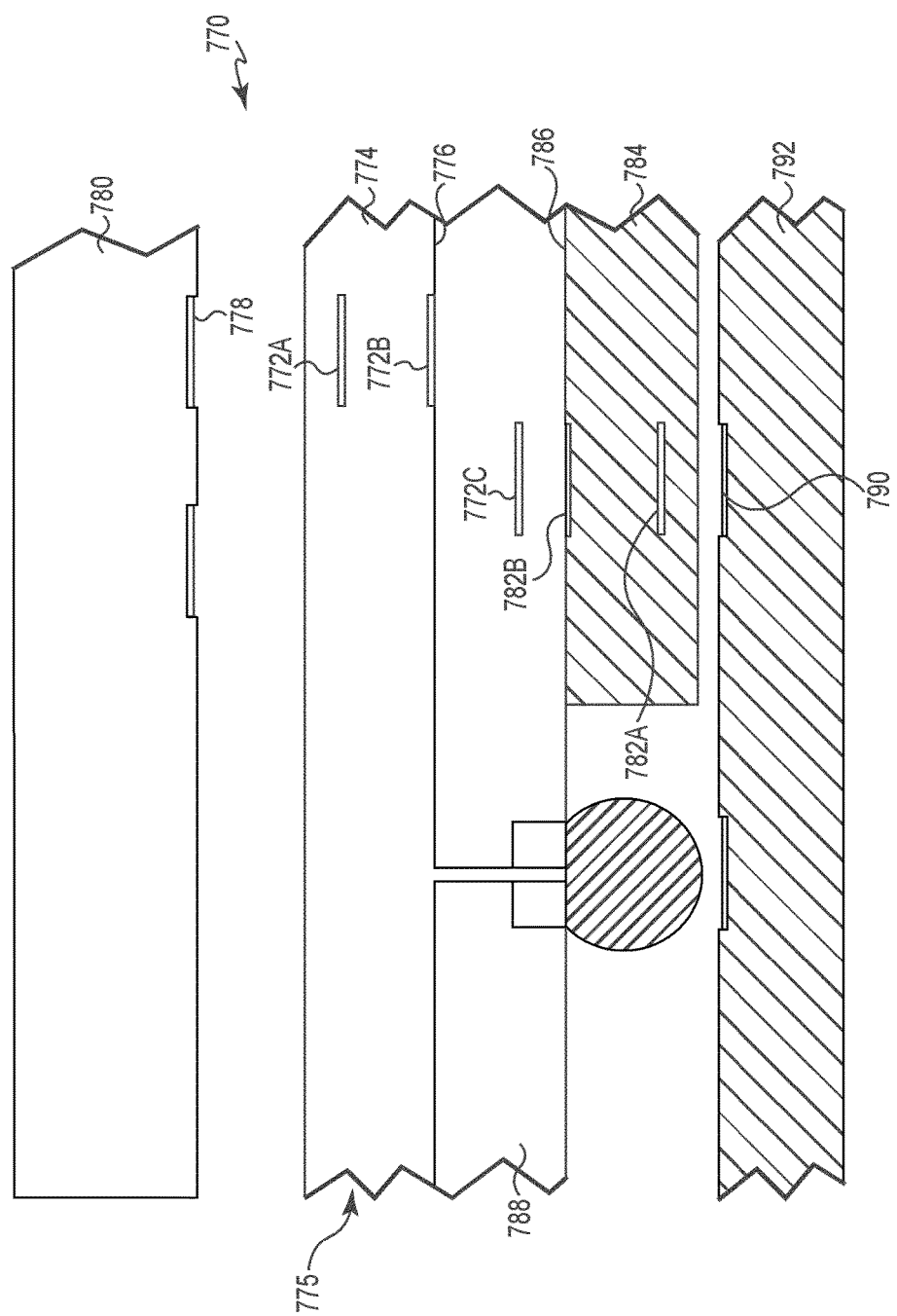
FIG. 29 illustrates an electrical interconnect for an IC package with capacitive coupling in accordance with an embodiment of the present disclosure.

FIG. 29 is a cross-sectional view of electrical interconnect 770 with various capacitive coupling features for use in an IC package in accordance with another embodiment of the present disclosure. A capacitive coupling feature 772A is embedded in layer 774 of the substrate 775. A capacitive coupling feature 772B is located on second surface 776 of the layer 774. The capacitive coupling features 772A, 772B are positioned to electrically couple with contact pad 778 on integrated circuit device 780. The capacitive coupling 772C is embedded in layer 788.

Capacitive coupling feature 782A is embedded in layer 784 of the substrate 775. Capacitive coupling feature 782B is located on first surface 786 of the layer 784. The capacitive coupling feature 782A is positioned to electrically couple with contact pad 790 on the PCB 792. The various capacitive coupling features in the embodiment of FIG. 29 are optionally formed using inkjet printing technology, aerosol printing technology, or other printing technology.

The electrical devices 722, 742 can be a power plane, ground plane, capacitor, resistor, filters, signal or power altering and enhancing device, memory device, embedded IC, RF antennae, and the like. The electrical devices can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like. The electrical devices can be added as discrete components or printed materials The availability of printable silicon inks provides the ability to print the electrical devices, such as disclosed in the patents previously referenced and incorporated herein by reference. For example, the electrical devices can be formed using printing technology, adding intelligence to the interconnect assembly. In particular, features that are typically located on the first or second circuit members can be incorporated into the interconnect assembly in accordance with an embodiment of the present disclosure.

The various embodiments of the present IC package can include printed electrical devices. The electrical devices can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like. In the illustrated embodiment, electrical devices include printed LED indicator and display electronics. Geometries can also be printed to provide capacitive coupling. Compliant material can be added between circuit geometry, such as discussed above, so the present electrical interconnect can be plugged into a receptacle or socket, supplementing or replacing the need for compliance within the connector.

The electrical devices are preferably printed during construction of the IC package. The electrical devices can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices can be formed using printing technology, adding intelligence to the high performance electrical interconnect. Features that are typically located on other circuit members can be incorporated into the interconnect in accordance with an embodiment of the present disclosure.

The availability of printable silicon inks provides the ability to print electrical devices, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices can also be created by aerosol printing, such as disclosed in U.S. Pat. No. 7,674,671 (Renn et al.); U.S. Pat. No. 7,658,163 (Renn et al.); U.S. Pat. No.

7,485,345 (Renn et al.); U.S. Pat. No. 7,045,015 (Renn et al.); and U.S. Pat. No. 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layers are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A method of making an area array integrated circuit (IC) package for an IC device, the method comprising the steps of:
    electrically coupling a first surface of the IC device to conductive traces on a first surface of a first substrate;
    mechanically coupling a first surface of an interconnect assembly to the first surface of the first substrate;
    locating contact members in openings formed in a second surface of the interconnect assembly, the contact members including elongated beams extending in the openings generally perpendicular to the second surface of the interconnect assembly;
    electrically coupling the contact members located in the openings in the interconnect assembly to the conductive traces on the first surface of the first substrate;
    positioning a second substrate opposite the IC device and the first surface of the first substrate, the interconnect assembly maintaining a separation between the first and second substrates that creates a recess and maintaining a separation between a second opposite surface of the IC device and the second substrate, the separation between the first and second substrates being greater than a separation between the first and second surfaces of the IC device, so the IC device is located in the recess and interposed between the first and second substrates;
    inserting solder balls attached to, and electrically coupled with, conductive traces on a second substrate into the openings located along a second surface of the interconnect assembly so that the first substrate, the interconnect assembly, and the second substrate substantially surround the IC device; and
    electrically coupling the solder balls on the second substrate to the contact members located in the openings in the interconnect assembly, comprising deflecting contact beams on the contact members outward to mechanically compressively couple with the solder balls.

2. The method of claim 1 wherein the second substrate comprises one of a PCB, a flexible circuit, a packaged IC device, or another IC package.

3. The method of claim 1 comprising the step of deflecting contact beams on the contact members outward to electrically couple with solder balls attached to, and electrically coupled with, the conductive traces on the first or second substrates.

4. The method of claim 1 comprising the steps of:
    bonding electrically conductive contact tabs to a first surface of the interconnect assembly so that contact tips on the contact tabs extend into the openings in the interconnect assembly; and
    inserting solder balls attached to, and electrically coupled with, the conductive traces on the first or second substrates into the openings to electrically couple with the contact tabs.

5. The method of claim 4 comprising the step of locating a plurality of conductive contact tabs that extend into the openings in a spaced configuration.

6. The method of claim 1 comprising forming the interconnect assembly as a layered structure wherein one of the layers comprise a circuitry plane selected from one of a ground plane, a power plane, an electrical connection to other circuit members, a dielectric layer, or a flexible circuit.

7. The method of claim 1 comprising the steps of:
  printing at least one printed electrical device on the interconnect assembly; and
  electrically coupling the electrical device with at least a one of the contact members.

8. The method of claim 1 comprising attaching the interconnect assembly to the first substrate using surface mount technology.

\* \* \* \* \*